United States Patent
Hosono et al.

(10) Patent No.: US 6,907,497 B2
(45) Date of Patent: Jun. 14, 2005

(54) NON-VOLATILE SEMICONDUCTOR MEMORY DEVICE

(75) Inventors: Koji Hosono, Yokohama (JP); Kenichi Imamiya, Tokyo (JP); Hiroshi Nakamura, Fujisawa (JP); Mikito Nakabayashi, Chigasaki (JP); Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 264 days.

(21) Appl. No.: 10/325,714

(22) Filed: Dec. 20, 2002

(65) Prior Publication Data

US 2003/0214853 A1 Nov. 20, 2003

(30) Foreign Application Priority Data

Dec. 20, 2001 (JP) .................................. 2001-388347

(51) Int. Cl.⁷ .............................................. G06F 12/00
(52) U.S. Cl. ............. 711/103; 365/185.22; 365/185.24; 365/185.3; 365/185.33
(58) Field of Search ..................... 711/103; 365/185.22, 365/185.24, 185.29, 185.3, 185.33

(56) References Cited

U.S. PATENT DOCUMENTS 5,742,541 A * 4/1998 Tanigami et al. ........ 365/185.3
5,936,890 A    8/1999 Yeom

FOREIGN PATENT DOCUMENTS

| JP | 10-027487 | 1/1998 |
|---|---|---|
| JP | 11-260076 | 9/1999 |
| JP | 2000-100178 | 4/2000 |

OTHER PUBLICATIONS

A sampling weak–program method to tighten Vth–distribution of 0.5 V for low–voltage flash memories. Shiga, H. et al.. VLSI Circuits, 1999. Digest of Technical Papers. 1999 Symposium on , Jun. 17–19, 1999 pp.:33–36.*

U.S. Appl. No. 09/800,913, filed Mar. 8, 2001, Hosono et al.

* cited by examiner

Primary Examiner—Matthew D. Anderson
(74) Attorney, Agent, or Firm—Hogan & Hartson, LLP

(57) ABSTRACT

A non-volatile semiconductor memory device includes a memory cell array, a data hold circuit, and a controller A program control function applies a program voltage to a selected memory cell to let data shift from a first logic state to a second logic state. A program verify control function verifies that a programmed data of the selected memory cell shifted to the second logic state. An erratic program verify control function checks that a threshold voltage of a memory cell to be held in the first logic state does not exceed a third value set as an upper limit value of a variation of the first logic state. An over-program verify control function checks that a threshold voltage of the selected memory cell shifted to the second logic state does not exceed a fourth value set as an upper limit thereof.

22 Claims, 19 Drawing Sheets

FIG. 12
State A4 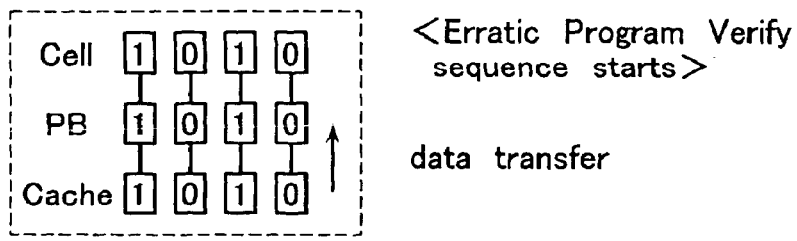 <Erratic Program Verify sequence starts>
data transfer
State B4 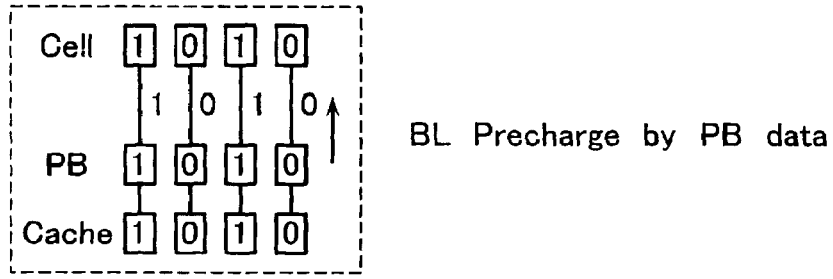 BL Precharge by PB data
State C4 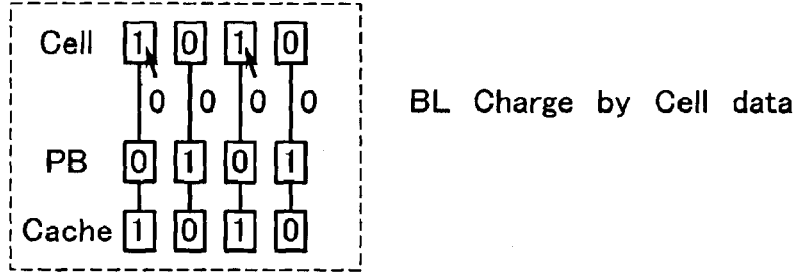 BL Charge by Cell data
State D4 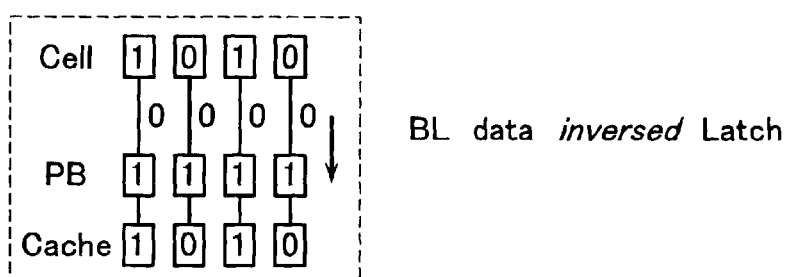 BL data *inversed* Latch
State E4 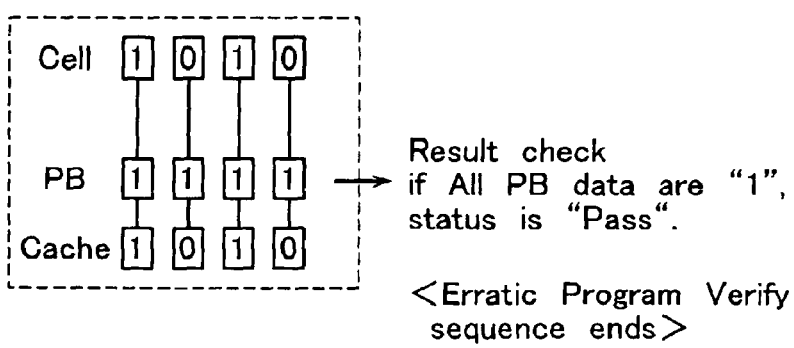 Result check
if All PB data are "1", status is "Pass".
<Erratic Program Verify sequence ends>

[Erase Verify]

[Erratic Program Verify(1)]

[Erratic Program Verify(2)]

NON-VOLATILE SEMICONDUCTOR MEMORY DEVICE

CROSS-REFERENCE TO RELATED APPLICATION

This application is based upon and claims the benefit of priority from the prior Japanese Patent Application No. 2001-388347, filed on Dec. 20, 2001, the entire content of which is incorporated herein by reference.

BACKGROUND OF THE INVENTION

1. Field of the Invention

This invention relates generally to an electrically erasable programmable read only memory (EEPROM) device. More particularly, the invention relates to programming control techniques adaptable for use with the nonvolatile memory devices.

2. Description of Related Art

EEPROM memory cells are generally designed to employ metal oxide semiconductor (MOS) transistors with stacked structures of a floating gate and a control gate. In flash EEPROM memories of the so-called NAND type, a plurality of memory cells are connected in series together to make up a NAND cell unit. The NAND-type flash memories store data in a nonvolatile way while regarding a threshold voltage-increased state due to injection of electrons into the floating gate of a memory cell as a data bit of logic "0" (write or program state) and letting a threshold voltage-decreased state due to release or discharge of the electrons on the floating gate be a data bit of logic "1" (erase state). One examplary threshold voltage distribution pattern of the data is shown in FIG. 4. A data writing or "programming" operation is performed by controlling via a bit line the channel potential of a NAND cell unit in a data-dependent way and then applying a program voltage to a selected word line. An ordinary programming operation is performed as follows.

When the program data is a logic "0," apply a voltage of 0 volt (V) to a corresponding bit line, thereby precharging the channel of a NAND cell unit to 0V through a select gate transistor of the NAND cell unit. When the program data is a logic "1" (program inhibited), apply Vdd (V) to a corresponding bit line, then transfer it to a NAND cell unit's channel through a select transistor. In this case, the channel is precharged to Vdd–Vt (where, Vt is a threshold voltage of the select transistor) to be floating state with a potential level Vdd–Vt. Then, give a potentially raised or "boosted" program voltage Vpgm to a selected word line. Based on the program voltage application, at the cell with logic "0" data given thereto, a sufficiently high voltage is applied between the gloating gate and the channel. As a result, its threshold voltage gets higher due to electron injection from the channel into the floating gate. In the cell with "1" data given thereto, the floating NAND cell unit channel is boosted by the program voltage Vpgm applied to the selected word line and the pass voltage Vpass applied to non-selected word lines. Therefore, since no electron injection into the floating gate takes place, the "1" data cell stays unchanged.

In a practical data program operation, as shown in FIG. 5, applying a program pulse voltage and reading data for verification—say, verify-read—are recurrently performed while gradually shifting a program pulse voltage value in a stepwise fashion, thereby forcing the data "0" to finally fall within a prespecified range of threshold-voltage distribution.

In the program-verify operation, a verify read voltage Vpv is applied to the selected word line. When the threshold voltage of the selected cell is over Vpv by the just before program pulse application, the programming operation for the selected cell is ended. When the threshold voltage of the selected cell is lower the Vpv, the programming operation for the selected cell is continued.

Such the programming control for the respective selected memory cells is performed in a page buffer. The page buffer is configured to have a sense amplifier function and a data latch function that is to temporarily hold read data and program data.

Program data of one page are loaded in the page buffer at the beginning of the program operation. "0" and "1" respectively. When a "0" programmed cell becomes to have a predetermined threshold voltage, a logic "H" data (i.e., "1" data) is latched in the page buffer as a result of bit line sensing in the program verify-read operation. By contrast, with respect to a "1" programmed cell, logic "H" data (i.e., "1" data) is held in the page buffer in spite of the result of bit line sensing. Therefore, by repeating the program pulse application an the verify-read until when all data bits of the page buffer become logic "1"s, it is able to program desirable data into all memory cells within a selected page.

Data erase is done in units of NAND cell blocks. Each NAND cell block has plurality of NAND cell units in a direction along word lines—say, wordline direction. More specifically, all of the memory cells in the NAND cell block are erased at a time. This is called as "all-at-a-time" or "all-at-once" erase in the flash memory device art. To perform such all-at-once erase for a selected NAND cell block, let all the word lines associated with this cell block be set at 0V, and apply a boosted erase voltage Vera to a semiconductor well region in which the NAND cell block is formed and also to the channel regions of memory cell transistors therain. With such voltage application, every memory cell experiences release of electrons on its floating program verify control function is performed by precharging gate toward the channel thereof and thus is set in the data "1" storage state with a lowered treshold voltage. In other words, all the cells are "erased" simultaneously.

In this data erase session also, performing a verify-read operation for checking the erase state makes it possible to force the threshold-voltage distribution to fall within a predetermined range.

In the EEPROM of the type stated above, the threshold voltage used as a reference level for deciding "0" data in a program verify-read is set at a lower limit value Vpv of the threshold voltage distribution of "0" data, as shown in FIG. 4. In most cases, no attempts are made to verify an upper limit value of the data "0" threshold voltage distribution. However, "0" programmed memory cells are accidentally programmed to have an unitentionally high threshold voltage beyond the expected threshold voltage distribution. This is called as an over-program or an over-write.

Once such an over-program occurs, it becomes impossible to precisely read out a cell data in such a NAND cell unit that includes an over-programmed cell. The reason is as follows. In the data read operation, a read voltage Vrr (for example, 0V) is applied to selected word line, and a pass voltage Vread is applied to non-selected word lines. The pass voltage Vread is predetermined as to be able to turn-on the non-selected memory cell regardless of whether the data held therein is "0" or "1". If an over-programmed cell is included in the non-selected cells, the cell current will be cut-off or limited at the over-programmed cell. As a result, "0" data will be read out regardless of whether the data of the selected cell is "0" or "1".

Additionally, "1" data-programmed memory cells (i.e., those expected to store logic "1" data) in the memory cells along a selected word line with the program voltage Vpgm applied thereto become in a weak "0" program mode. As a result, in "1" data-programmed memory cells, such erratic programs or erratic writes may occur that threshold voltages thereof become unusually higher than the upper limit, Vev, of "1" data threshold voltage distribution. As a result of such the erratic programs, some of the memory cells to be hold in a "1" data state may become erroneously programmed states with a threshold voltage lager than the read voltage Vrr as shown in FIG. 4, read data of which are determined as "0". Even when the cells that must store logic "1" data improperly behave to store "0" data, prior known program-verify schemes are incapable of detecting this kind of faults in any way.

Usually, a memory system has an error checking and correcting (ECC) circuit, the capability of which is designed in consideration of frequency of the above-described over-program and error program ocurrence. Therefore, in a normal data read operation, even if there are error bits due to the over-program or erroneous program, correct data corrected by the ECC circuit may be read out.

However, when considering such a copy operation as to copy a certain page data of an EEPROM to another page thereof, above-described error bits occurred in a program operation becomes a problem to be solved, because of that a page data including error bits are programmed to another page as it is. In order to solve such the problem, it is required to check the read out data and correct it when it includes error bits by the ECC circuit. However, the ECC processing takes time, even if only data check is performed, thereby preventing the speed-up of the page copy operation.

In order to perform a reliable copy operation without employing a ECC circuit, it is necessary to detect the above-described over-programmed cells and erroneously programmed cells in the programming sequence, and inform the resultant to the memory chip controller when such the cells are detected. Methods of over-program verify and erratic program verify for such the purpose have already been proposed at present day, one of which is disclosed, for example, in Published Unexamined Japanese Patent Application No. 2000-100178 ("JP-A-2000-100178"). As taught thereby, over-program verify operation is performed after the ordinary program operation is ended. In details, the verify-read operation is performed by applying a predetermined pass voltage to a selected word line to determine whether an over-program is present or not. However, even if such the over-program verify operation is added to the program sequence, the reliability of programming is not yet sufficient for achieving a high speed copy operation without use of ECC circuitry.

In regard to erratic programs, the above-identified Japanese document suggests that it may be performed after the ordinary program operation is ended. Erroneously programmed cells are detected by performing two read operations in which different voltages are applied to a selected word line. By such the two read operations, whether a selected cell's threshold is higher than the ordinary read voltage (i.e., 0V) or not, and whether it is lower than the lower limit of "0" data threshold distribution or not may be detected. Other proposals for the erratic program verify are the same as this. However, in such the proposed verify method, supposing that a cell threshold of which is nearly equal to 0V is verified as it was normally programmed ("Pass"), it easily becomes erronesously programmed state due to some variation causes after the program sequence.

SUMMARY OF THE INVENTION

A non-volatile semiconductor memory device includes a memory cell array in which electrically erasable and programmable memory cells are arrayed, each of the memory cells storing therein a first logic state with a threshold voltage lower than or equal to a first value or a second logic state with a threshold voltage higher than or equal to a second value that is higher than the first value, a data hold circuit for holding program data hold circuit also functioning as a sense amplifier circuit for sensing data as read out of the memory cell array, and a controller configured to control a program sequence for the memory cell array, wherein the controller has the control functions of: a program control function for applying, based on the program data loaded into the data hold circuit, a program voltage to a selected memory cell of the memory cell array to let the data shift from the first logic state to the second logic state; a program verify control function for reading the data programmed into the memory cell array and for verifying that the programmed data of the selected memory cell shifted to the second logic state; an erratic program verify control function for reading the data programmed into the memory cell array and for checking that the threshold voltage of a memory cell to be held in the first logic state does not exceed a third value set as an upper limit value of variation of the first logic state; and an over-program verify control function for reading the data programmed into the memory cell array and for checking that the threshold voltage of the selected memory cell shifted to the second logic state does not exceed a fourth value set as an upper limit thereof.

BRIEF DESCRIPTION OF THE DRAWINGS

FIG. 12 is a diagram showing changes of the page-buffer/cache data and the cell data in another erratic program verify sequence after programming.

DETAILED DESCRIPTION OF THE EMBODIMENTS

Embodiment 1

Figure 1:
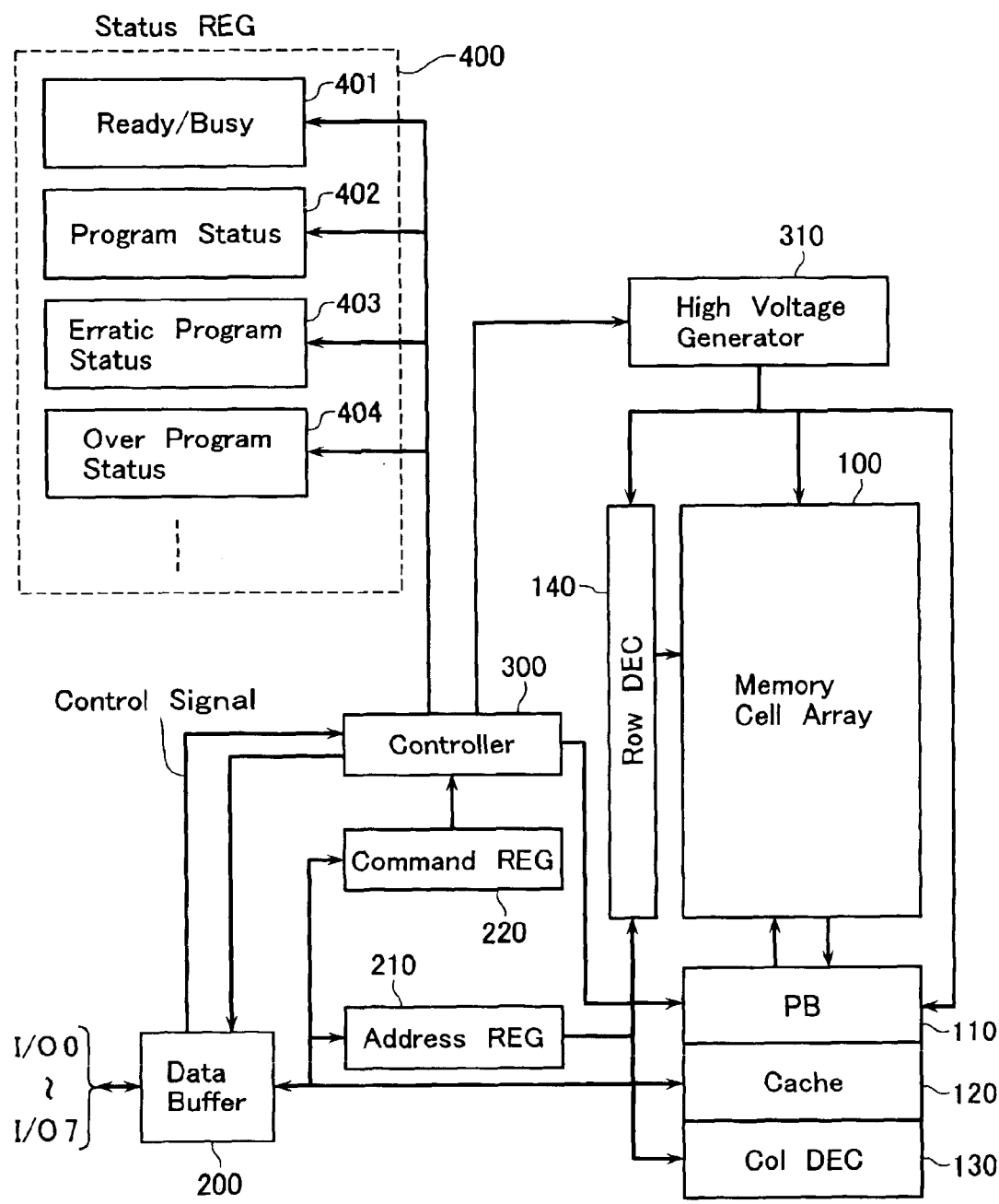
FIG. 1 is a diagram showing, in circuit block form, a configuration of a flash EEPROM memory in accordance with an embodiment of this invention.

Referring to FIG. 1, a flash EEPROM memory chip of the NAND type in accordance with an embodiment of this invention is illustrate in block circuit form. The NAND-type flash memory includes array of rows and columns of memory cells indicated by reference numeral 100, a row decoder 140 which performs word-line selection of this memory cell array 100, and a column decoder 130 which performs bit-line selection. Also provided is a page buffer (PB) 110 with a storage capacity corresponding to a page of memory space. The page buffer 110 functions as a sense amplifier circuit which detects or senses data read out of the memory cell array 100, and also acts as a data hold circuit that stores hold program data.

In currently available NAND flash memory chips, and data bits that have been loaded into the page buffer 110 at the beginning of a program (or write) operation are to be rewritten at the termination of the program operation. In contrast, the illustrative embodiment is specifically arranged so that in order to perform an operation for finding an erroneously programmed cell due to an erratic program (referred to hereinafter as an erratic program verify operation), the memory chip continues to store therein the initially held data even after completion of a program operation. To do this, two separate data storage circuits are provided with respect to a page of memory cells, each of which circuit retains once-loaded program data with no changes until the termination of a program operation. In the circuitry of FIG. 1, the page buffer 110 is one data hold circuit with sense-amplifier functionality. The other data hold circuit is a cache memory 120 which is data-transmittably connected the page buffer 110.

An address is taken into or "imported" to an address register 210 through an input/output (I/O) buffer 200 and is then transferred to the row decoder 140 and the column decoder 130. A control circuit 300 is operatively responsive to receipt of a control signal for controlling command address input and data input/output, performing sequence control such as data read, program and erase operations, and controlling the high voltage generation circuit 310 to produces a potentially raised or boosted high voltage as required for program/erase operations or else.

The flash memory chip of FIG. 1 also includes a status register module 400, which is operable under control of the controller 300 to notify external circuitry or equipment of various states of the flash memory. Status register 400 has a ready/busy register 410 which holds therein specific data indicative of whether the chip is in a ready state or a busy state, a program status register 402 which holds data indicative of whether a program event is "Pass" or "Fail," an erratic program status register 403 which holds data indicative of the presence or absence of an erratic program (i.e., pass/fail of erratic program verify), and an over-program status register 404 which holds data indicative of the presence or absence of an over-program state (pass/fail of over-program verify).

Figure 2:
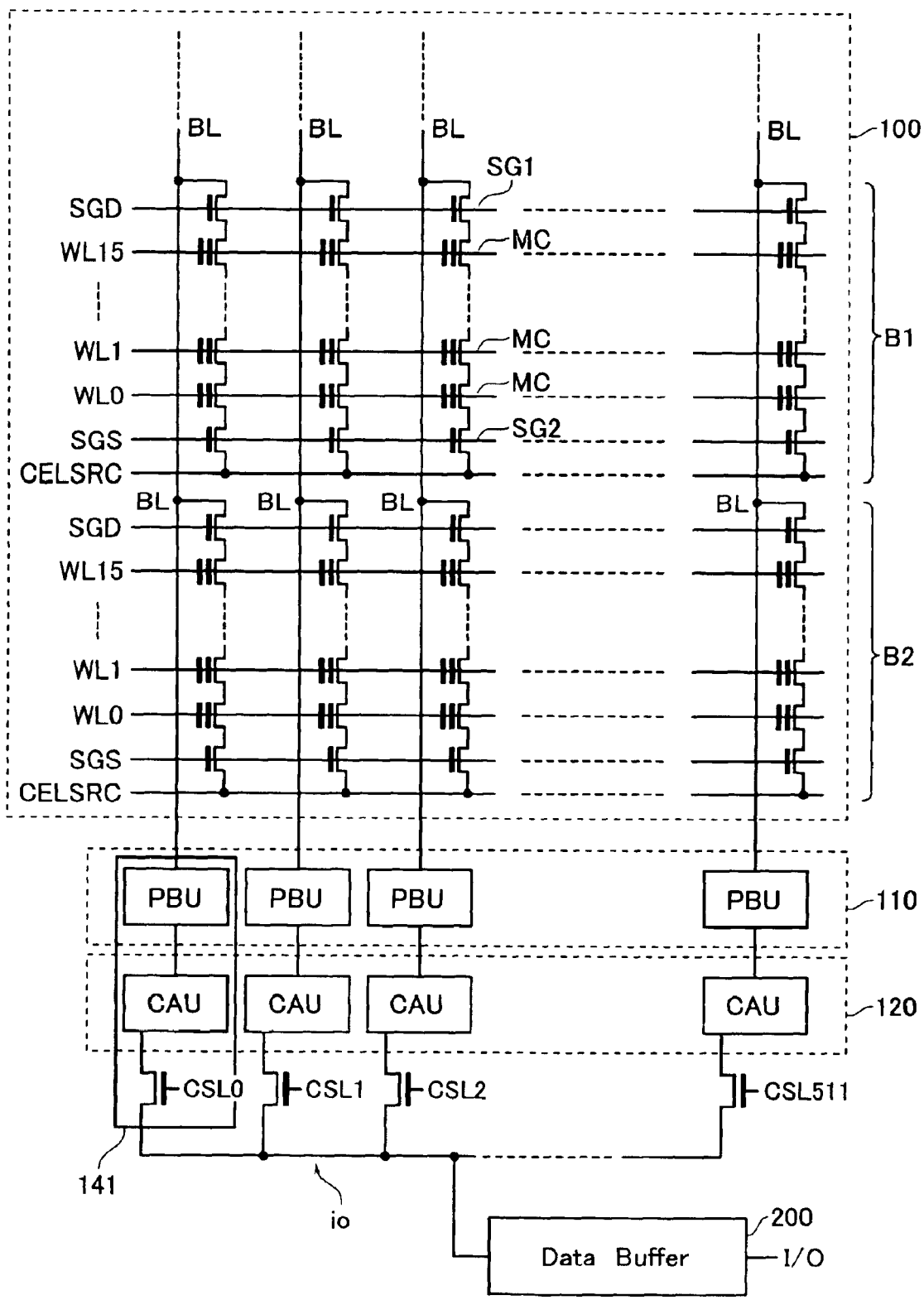
FIG. 2 is a diagram showing a configuration of a memory cell array of the embodiment.

As shown in FIG. 2, the memory cell array 100 consists essenetially of electrically rewritable nonvolatile memory cells MC arranged in a matrix of rows and columns. Each memory cell MC has a metal oxide semiconductor (MOS) transistor structure with its floating gate and control gate stacked or multilayered over each other. In this example, the memory cells MC are organized into NAND cell units, each having a serial combination of sixteen (16) memory cells MC. A memory cell MC at one terminate end of each NAND cell unit has its drain which is connected via a select gate transistor SG1 to a corresponding one of parallel bit lines BL. A memory cell MC at the opposite end has a source which is coupled via a select gate transistor SG2 to a common source line CELSRC.

Each row of memory cells MC have their control gates which are connected together to a word line WL1 ("1" is 1, 2, 3, . . . , n, where n is an integer) commonly associated therewith. A row of select gate transistors SG1 have gate electrodes which are connected to a "common" select gate line SGD. A row of select gate transistors SG2 have gate electrodes coupled together to a common select gate line SGS. Multiple memory cells MC along single word line WL1 provides a unitary memory space called "page" that stores data bits all of which are accessible simultaneously in a single write or read session. A group of 16 pages of memory cells neighboring in a direction along the columns makes up a cell block B1. Another group of 16 pages of cells in the column direction is defined as a cell block B2. Each cell block B1, B2 is for use as a unitary memory space storing data bits all of which are erasable simultaneously in a bulk erase session, also known as "all-at-a-time" or "all-at-once" erase.

As shown in FIG. 2, the page buffer 110 is configured from a prespecified number of page buffer units PBU to stores at least a page of data bits. The cache 120 is formed of the same number of cache units CAU. Practically for example, the page buffer 110 has a capacity for storing 528 bytes of data. Data latches making up the cache 120 may be the ones that are capable of storing write data within a fixed length of time period. Example of the data latches are inverter-combined latches and capacitive elements as will be set forth in detail later in the description.

Figure 3:
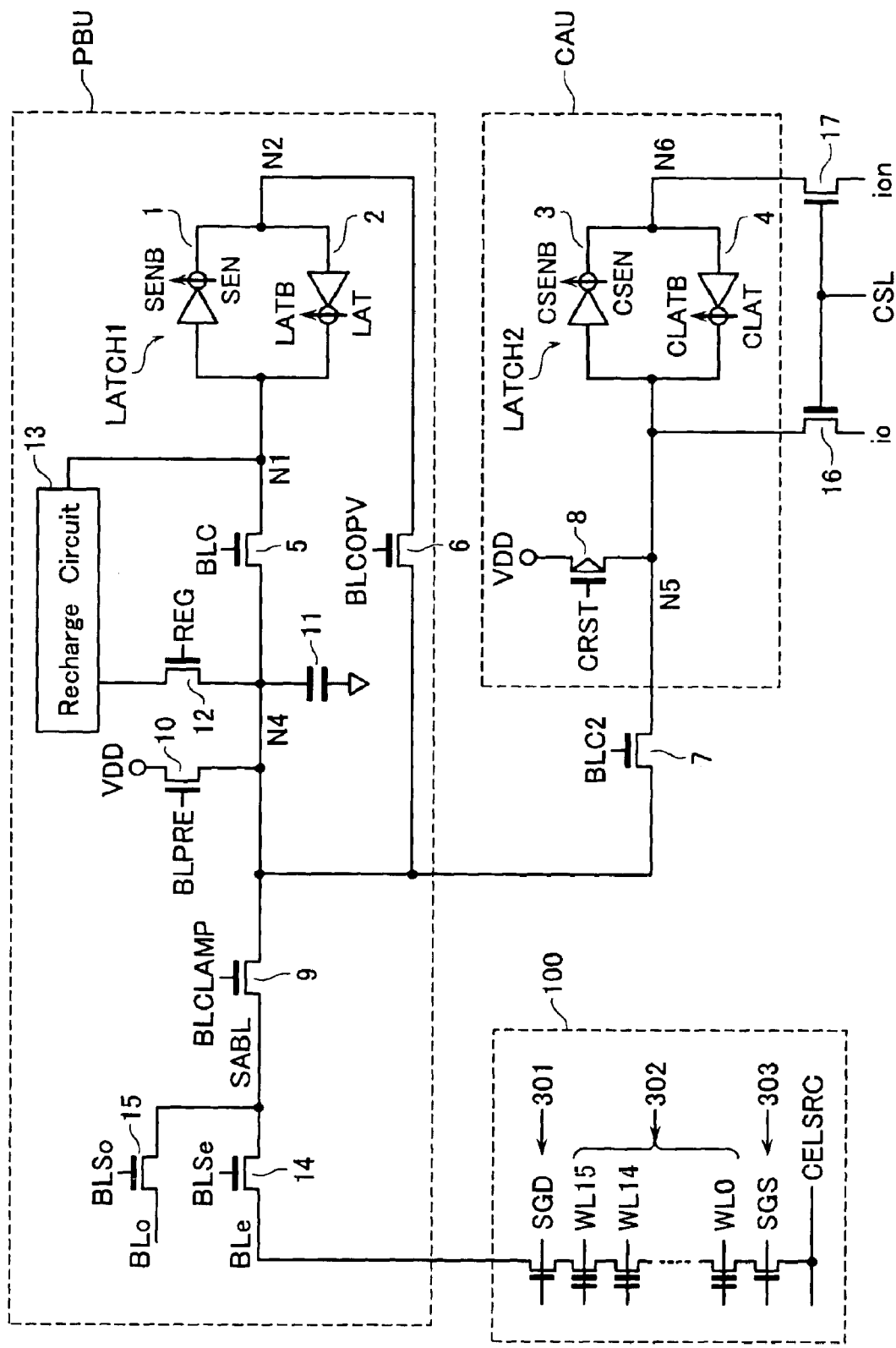
FIG. 3 is a diagram showing a configuration of circuitry including a page buffer and a cache unit of the embodiment.

Turning to FIG. 3, there is shown a practically implemented configuration of part 141 in FIG. 2, which includes a pair of one PBU of the page buffer 110 and its associated CAU of the cache 120. As shown herein, two bit lines BLe and BLo are connected to a single page buffer unit PSU through N-channel MOS (NMOS) transistors 14, 15, respectively, although these bit lines are replaceable with a single bit line or alternatively more than two bitlines. NMOS transistors 14, 15 receive at their gates control signals BLSe and BLSo. These signals are bitline select signals which are used for permitting access to a cell(s) associated with either one of the bitlines BLe and BLo.

A circuit node SABL which is connected to a bit line via the NMOS transistors 14, 15 is connected through NMOS transistors 9 and 5 to a node N1 of a latch circuit LATCH1, which is made up of a parallel combination of clocked inverters 1, 2 with reverse polarities each other. NMOS transistor 9 is used during read operation to perform a precharge operation for precharging a selected bit line, and a sensing operation for sensing the bit line potential after when the bitline is discharged by a selected cell for a certain period. NMOS transistor 5 is used for control of data transferring between nodes N1, N4 at a prespecified timing. NMOS transistors 5, 9 are connected together at node N4, which in turn is coupled to an NMOS transistor 10 This transistor 10 is for appropriately precharging the bitline and nodes N4, N1 when required. Additionally, an NMOS transistor 12 and a recharging circuit 13 are used during program verify read operations for holding a "1"-programmed cell as it is. In details, this recharging circuitry has a function as follow: once a "1"-program data or a logic "H" data corresponding to a program verify "pass" data is set to the node N1 of the latch circuit LATCH1 during a verify read operation, the recharging circuitry restores a logic "1" data to the node N1 regardless of the result of bit line sensing.

In a normal read operation and verify-read operation, data is taken into the node N1 after having amplified a bitline voltage potential at the node N4. In these events, an NMOS transistor 6 is interposed between the node N4 and a remaining nod N2 of the latch circuit LATCH1. Sending the bitline data to the latch LATCH1 via this NMOS transistor 6 and then holding the data therein makes it possible to latch data that is a logically inverted version of the data available during the normal read operation. This is a remedy for inversion read and inverted data transfer to be later described in the description.

The node N4 is connected through a transfer gate NMOS transistor 7 to a node N5 of a latch circuit LATCH2 which consists essentially of a parallel combination of clocked inverters 3, 4 with reverse polarities each other. This latch circuit LATCH2 is a main body of "core" of the cache unit CAU. Latch circuit LATCH2 has nodes N5, N6 which are connected via NMOS transistors 16, 17 to data lines io, ion. NMOS transistors 16–17 have their gates, to which a column select signal CSL is supplied. When the column select signal CSL is a "High" ("H") level, data input/output is enabled between latch LATCH2 and circuitry external to the chip. Connected to node N5 is a P-channel MOS (PMOS) transistor 8 which is for resetting the latch data of cache unit CAU.

An explanation will next be given of an on-chip system procedure for control of a program or write operation of the flash EEPROM memory thus arranged, in which an erratic program verify process is included for finding an erroneously programmed cell.

Figure 6:
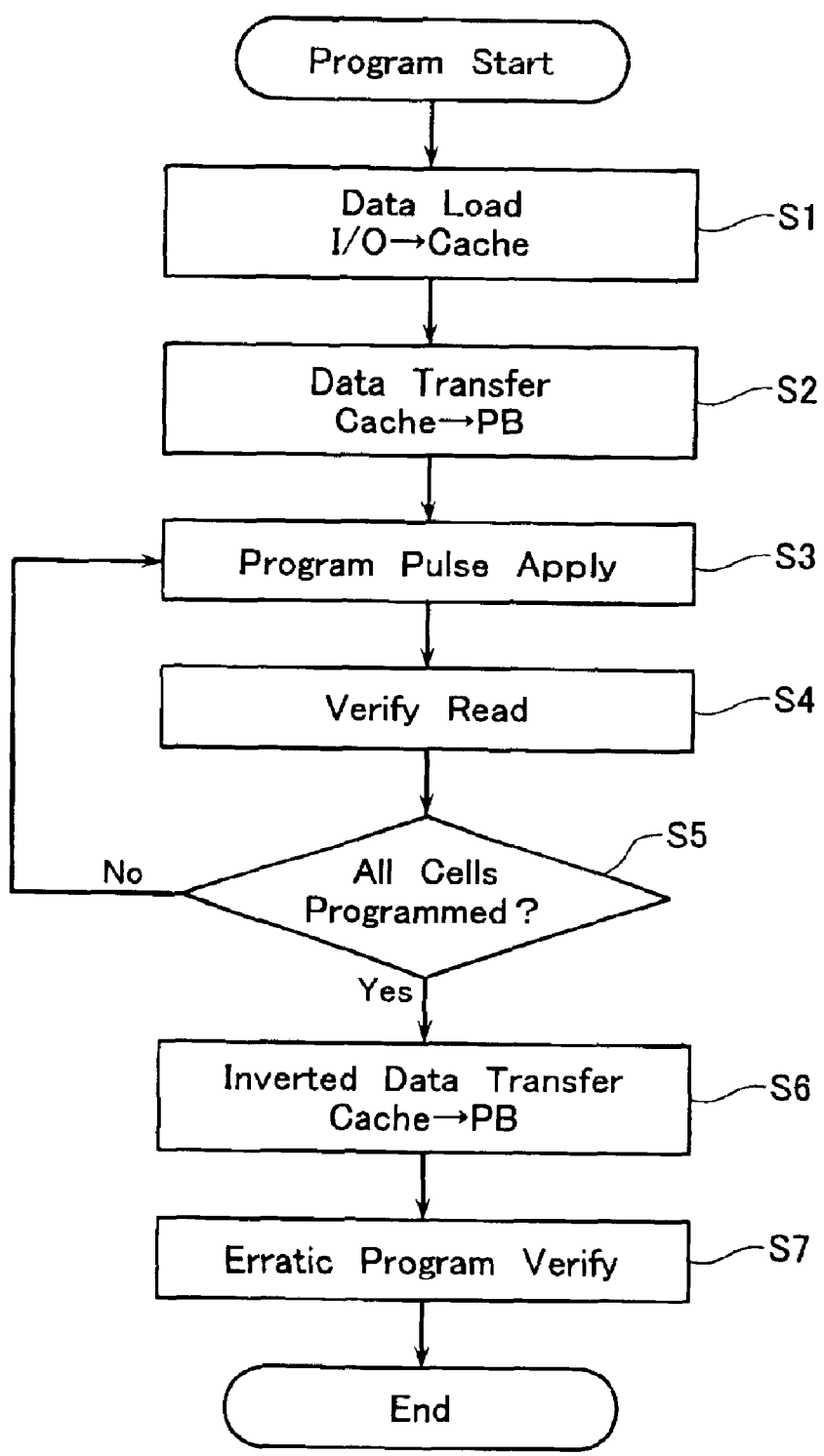
FIG. 6 is a flow chart showing a system procedure in which a program operation is performed to include an erratic program verify process in accordance with an embodiment.
Figure 9:
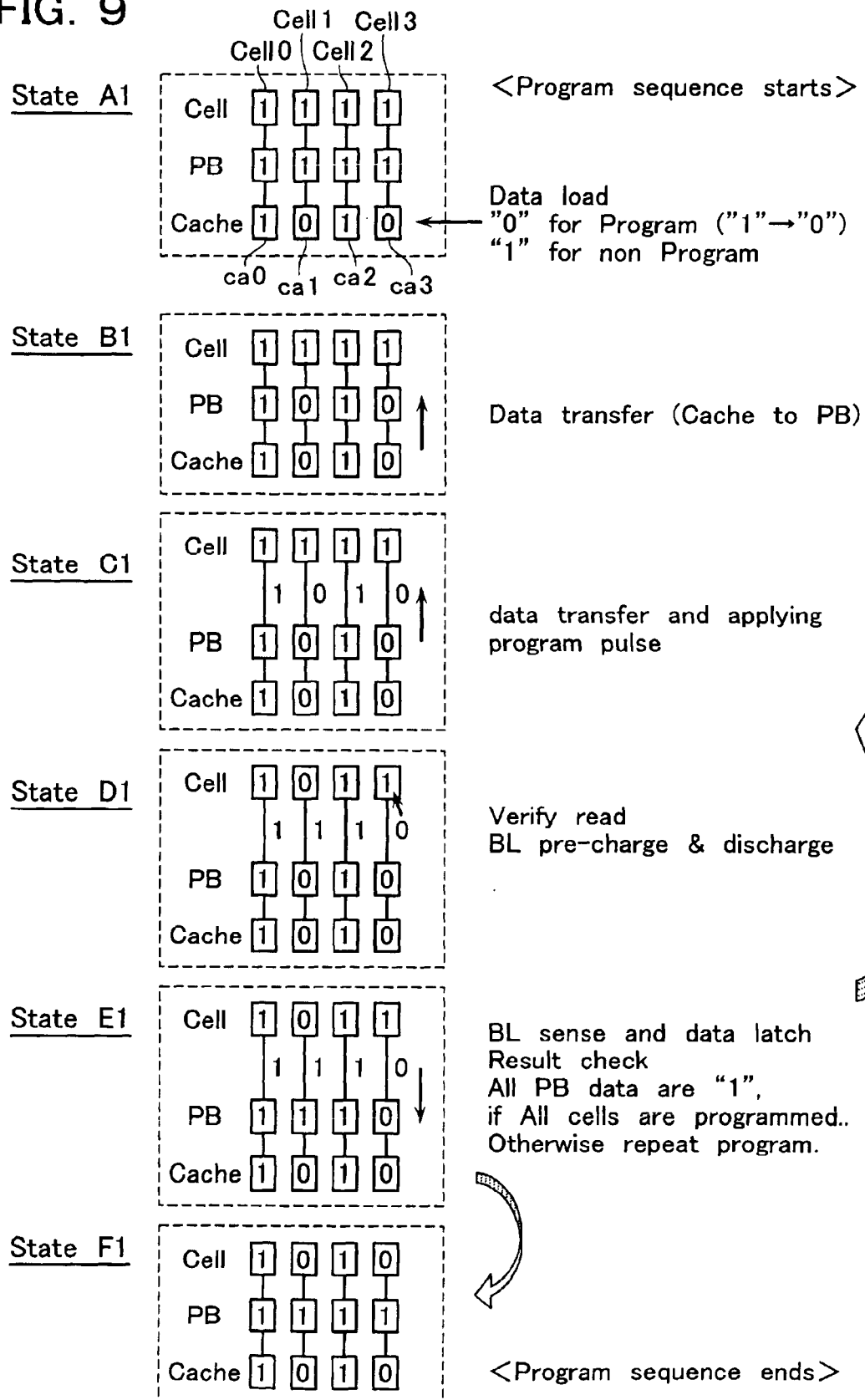
FIG. 9 is a diagram showing a pictorial representation of logic level changes of data bits of the page buffer and the cache along with cell data bits in a program sequence.

See FIG. 6. This is a flow diagram of a system procedure for control of a program operation. Also see FIG. 9, which depicts several possible change patters of cell data bits in its program sequence and of data changes of the page buffer (PB) 110 and cache 120, with respect to four bits of cells Cell0 to Cell3 by way of example. In FIG. 9, PB data and Cache data are those at nodes N1 and N5 respectively.

In a data erase state, all of the cells Cell0–3 store logic "1" data (see State A1 of FIG. 9). Under this condition, the program control procedure of FIG. 6 begins with step S1 which accommodates or "imports" program data into the cache 120 from external input/output terminals. Then, the procedure goes to step S2, which transfers the data toward the page buffer 110. The result is shown by State B1 in FIG. 9. Here, an example is shown, wherein program data items ca0="1," ca1="0," ca2="1," and ca3="0" are loaded with respect to the cells Cell0–3.

Subsequently, the system routine proceeds to step S3 which performs a program pulse application operation. At this step, transfer data from page buffer 110 to bit lines BL1 coupled to memory cell Cell0–3 as shown by State C1 in FIG. 9. More specifically, a voltage of 0V corresponding to logic "0" data transferred to bit lines associated with the "0"-program memory cells Cell1, 3; a voltage Vdd equivalent to logic "1" data is sent to bit lines associated with the "1"-program memory cells Cell0, 2. Thereafter, apply a program pulse voltage Vpgm to a selected word line WLi. Apply an intermediate voltage (pass voltage) Vpass lower than the program voltage Vpgm to the control gates (non-selected word lines) of nonselected or "unselected" memory cells which are connected in series to the selected memory cells Cell0–3 being applied the program voltage Vpgm within NAND cell units. In a selected NAND cell block, simultaneously apply the voltage Vdd to the select gate line SCD on the bit-line BL side.

As a result, at the cell into which "0" data bit is to be written, its channel is set at 0V with its control gate being applied a voltage of about 20V. Thus, a Fowler-Nordheim (FN) tunnel current flows therein, causing electrons to be injected to its floating gate. This results in an increase in threshold voltage of the cell. On the other hand, in the memory cell retaining logic "1" data storage state, its channel is charged-up to Vdd–Vt (where Vt is the threshold voltage of the select transistor), and becomes floating with a potential level of Vdd–Vt due to power supply voltage Vdd application to bit line BL and also by voltage Vdd application to the select gate line SGD. As a result, when program voltage Vpgm and pass voltage Vpass are applied to the NAND cell unit, the channel potential is boosted over Vdd due to capacitive coupling. Therefore, the potential difference between the control gate and the floating channel is held small. Thus, data writing or programming (electron injection) is not occurred in the unselected cells and "1" program cells.

Subsequently, the routine of FIG. 6 goes to step S4. At this step, precharge all of the selected bit lines BL to a specified potential level; then, apply a read voltage Vpv needed for threshold voltage judgment to the selected word line WLi; next, let the charge accumulated on bit line BL discharge through the selected memory cells Cell0–3 (State D1 of FIG. 9). If threshold voltage of a memory cell is higher than Vpv, cell current hardly flows. Thus, a decrease in precharge level of the bitline is less, permitting "H" level to be brought and stored to PB by a following sense operation. This means what is called a "0"-program "Pass" state. On the other hand, at a "0"-programmed memory cell, if its threshold voltage is lower than Vpv, an increased amount of cell current flows, resulting in an increase in bitline potential drop. Thus, "Low" ("L") level is taken and settled in PG during a following sense operation. This means a program "Fail" state, that is, a process of programming is failed.

At the part whereat logic "1" write is done to "1" state cell, during verify-reading, although the bitline potential is temporarily discharged by the "1" state cell after completion of bitline precharging, "1" data is forcibly taken into the "1" write part NMOS transistor 9 and recharging circuit 13. In a case that logic "0" is programmed into a cell to which "0" program is done, the data of its corresponding buffer unit PBU is inverted to "1" based on the result of verify read. For a cell which is deficient in "0" program, the data of page buffer unit PBU is continuously held at the initial data of logic "0." State E1 of FIG. 9 shows an exemplary case where one, cell Cell1, of the "0" programming cells Cell1, 3 is programmed in a logic "0" state, and another—cell Cell3—is deficient in programming.

In this case, at decision step S5 of FIG. 6, it is determined that all cells are not successfully programmed yet. If this is the case, the system routine returns to step S3 which again performs the program pulse applying operation with respect to an insufficiently programmed cell(s) only, and then proceeds to stop S4 which performs again the verify-read operation therefor. These steps S3–S8 will be repeated until all cells to be "1" programmed are sufficiently "1" programmed. During this repeated execution of the programming operation, let the program pulse voltage Vpgm stepwise increase in potential by Δpgm at a time, resulting in acceleration of the program operation. Even through such re-execution of the program operation, the memory cell merely shifts in threshold voltage by a degree equivalent to Δpgm. Thus, even through repeated execution of program and verify operations, the resultant program-state threshold voltage distribution width is finally controlled to stay at ΔVpgm+á. Here, "+á" is the width of a threshold voltage distribution due to noise components in the cell array. If at step S5 the data bits of the page buffer 110 are all logic "1" s after completion of the verify-read operation, that is, if "Yes" at step S5 of FIG. 6, then the program operation with respect to all the selected cells is completed, resulting in establishment of State F1 shown in FIG. 9.

Thereafter, in this embodiment, an erratic program verify operation is performed for detecting erroneous programs or program errors in the "1" programmed cells (program inhibit cells) in the memory cells along the selected word line. This erratic program verify-read operation is indicated by steps S6, S7 in the flowchart of FIG. 6. More specifically, if "Yes" at step S5, the system routine goes to step S6 which inverts the program data held in the cache 120 and then sends inverted data to the page buffer 110. At step S7, compare or collate such data to the actually programmed or written memory cell data.

In regard to details of the program verify and erratic program verify operations, an explanation thereof will later be given after the explanation of a normal read operation, for purposes of comparison with the normal read operation.

Figure 13:
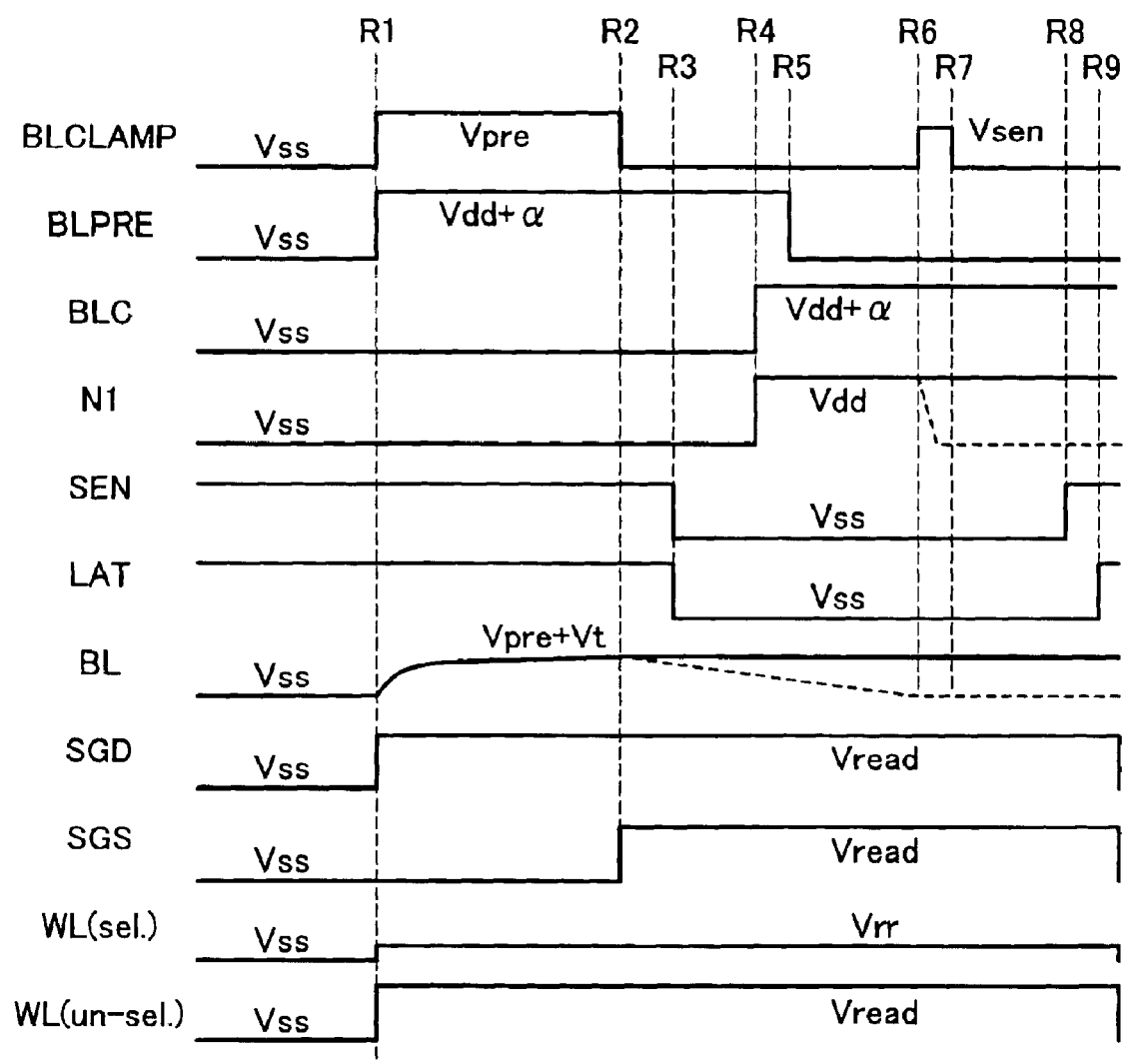
FIG. 13 is a timing diagram of a regular or "normal" program operation.

Referring to FIG. 13, a timing chart is shown of a regular or normal data read operation. At a time point R1 apply a voltage of Vdd+á to the gate of NMOS transistor 10 while applying a bitline precharging clamp voltage Vpre to the gate (BLCLAMP) of NMOS transistor 9. Whereby, a selected bit line is precharged at a potential level of Vpre−Vt, where Vt is the threshold voltage of NMOS transistor 9. Simultaneously, apply a read voltage Vrr to a selected word line of a selected NAND cell block, and also apply a pass voltage Vread to the select gate line SGD and nonselected word lines, thereby precharging the part covering from the bitline to the channel of memory cell to be read.

At a time point R2, set the gate (BLCLAMP) of NMOS transistor 9 at 0V; also, give the pass voltage Vread to the source-side select gate line SGS of the selected NAND cell block while letting is bit line be electrically floating. With such voltage application, if the threshold voltage of the selected memory cell is higher than the read voltage Vrr of the selected word line, the bit line hardly experiences discharging. If the threshold voltage of the selected memory cell is lower than the read voltage Vrr of the selected word line, read current flows through the selected memory cell, whereby the bitline is discharged.

At time point R3, let the latch circuit LATCH1 on the page buffer PB side be in an inactive state. Then, within a time period between time points R4 and R5, precharge not only the node N4 but also the node N1 to a voltage nearly equal to Vdd. And at time point R6, apply a sense-use voltage Vsen (<Vpre) to the gate of NMOS transistor 9. As a result, the nodes N4, N1 are connected to their associated bit line in the clamp state lower in potential is less than Vsen−Vt (where, Vt is the threshold voltage of NMOS transistor 9), the nodes N4, N1 are discharged to become almost equal in potential to the bitline. If higher than Vsen−Vt then NMOS transistor 9 cuts off, resulting in nodes N4, N1 being held at Vdd. At time point R8, let the clocked inverter 1 sense this potential. At time point R9, latch the sensed potential, and hold the read date.

Figure 14:
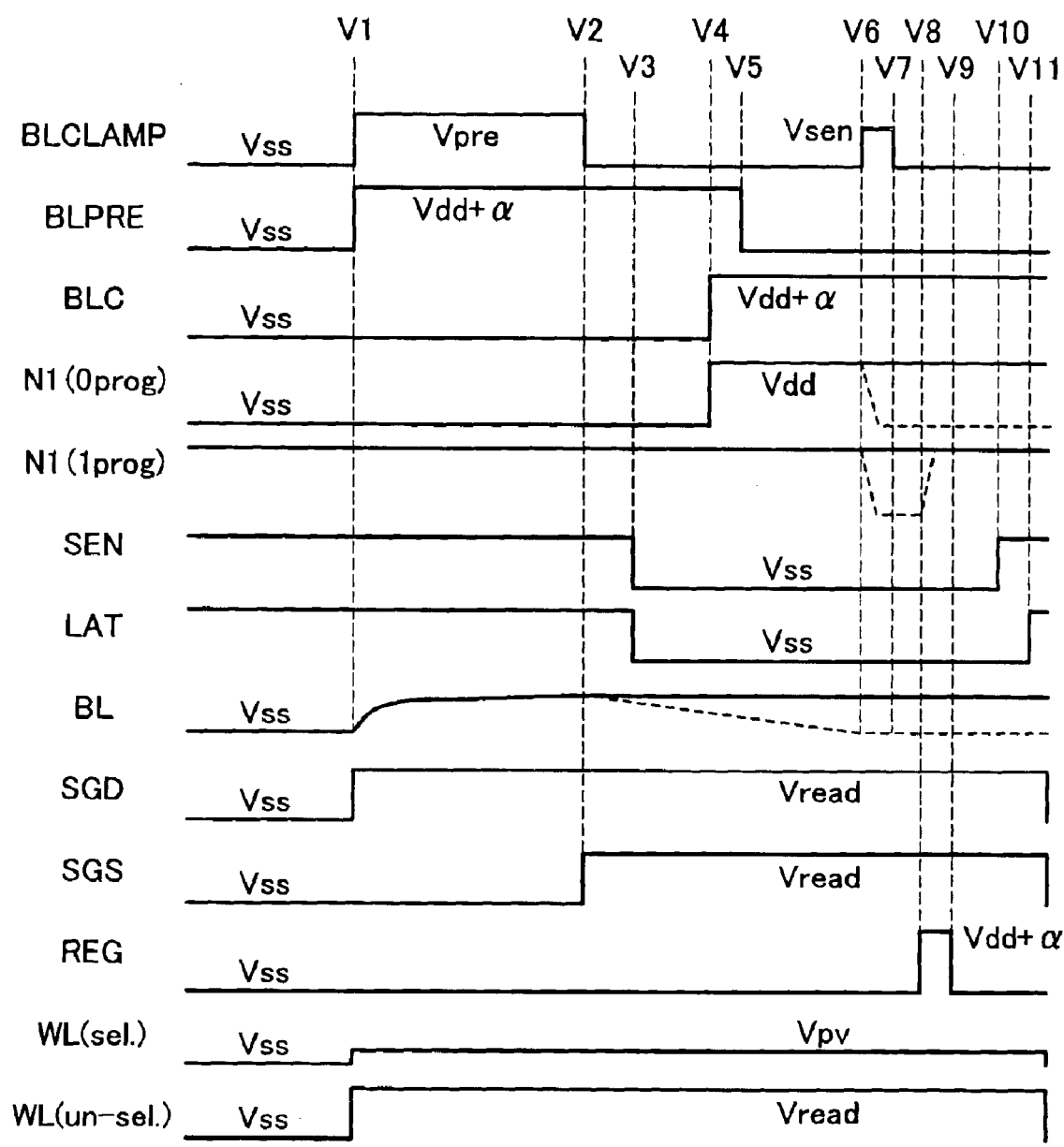
FIG. 14 is a timing diagram of a program verify operation.

See FIG. 14, which is a timing diagram of a program verify-read operation, wherein a time period spanning from time point V1 to V7 corresponds to the R1–R7 period of the normal read operation shown in FIG. 13. A difference of the program verify-read from the normal read is that the read voltage given to the selected word line is set at the potential level Vpv which is the reference voltage for "0" data judgment shown in FIG. 4. Another difference lies in that it is an operation within a time period between time points V8 and V9. More specifically, as in the normal read operation, the bitline voltage is amplified by the clamping operation of NMOS transistor 9; thereafter, a control signal REG of Vdd+α is applied in the V8–V9 period. With such voltage application, if logic "1" program is done by the program pulse applying operation immediately prior to this verify-reading, the nodes N4, N1 are again charged or recharged by the recharger circuit 13 when the NMOS transistor 12 turns on. And, during a period between time points V10 and V11, "H" level is sent and settled at the node N1 of latch circuit LATCH1. In case "0" program is done by the program pulse application operation just before the very-read, the potential which has been settled at the nodes N4, N1 until time point V7 is latched in the latch circuit LATCH1 since the recharger circuit 13 is off (in other words, supplies no potentials) even when NMOS transistor 12 is rendered conductive.

Figure 10:
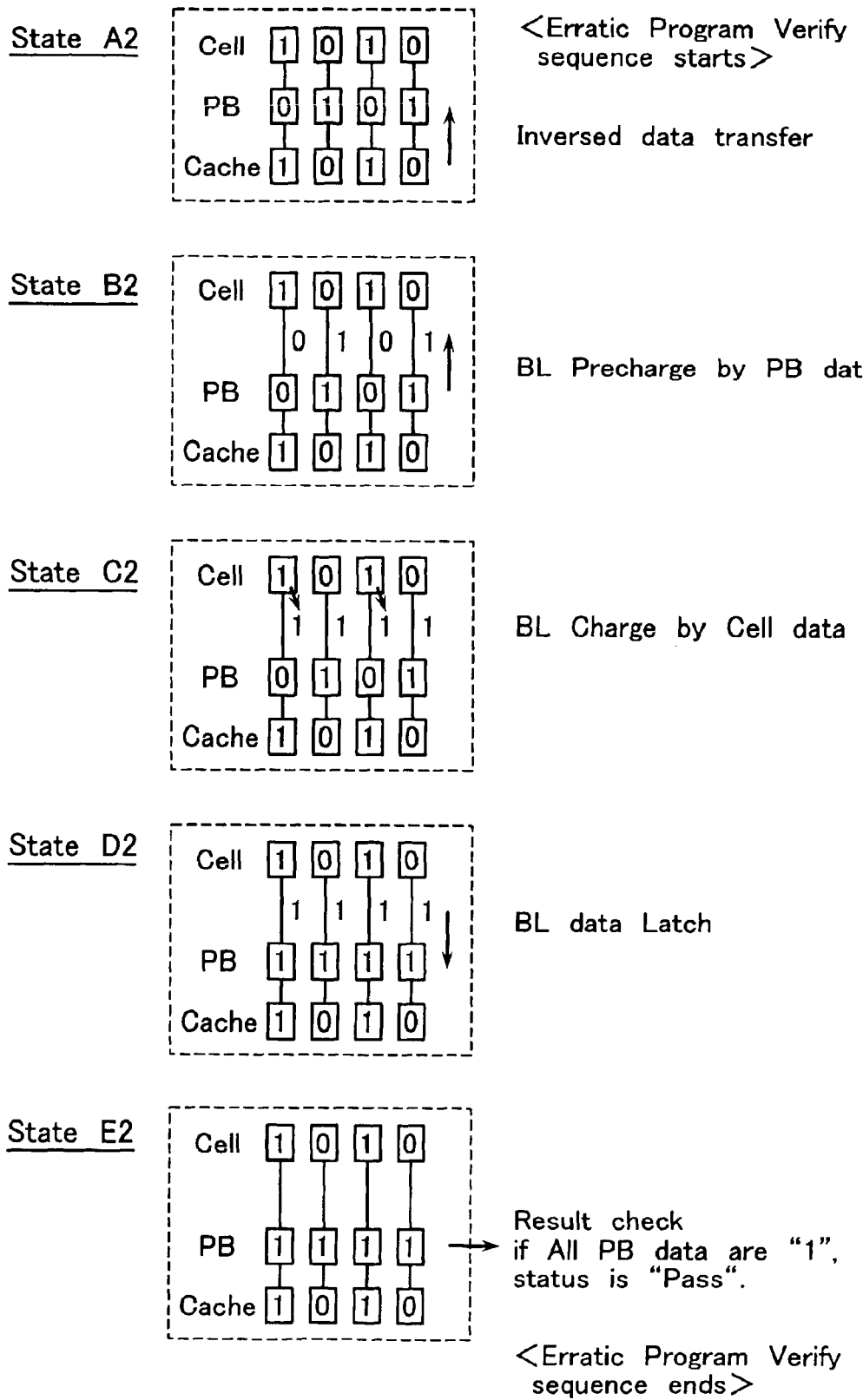
FIG. 10 is a diagram showing changes of the page-buffer/cache data and the cell data in an erratic program verify sequence after an erratic program verify sequence.

An explanation will next be given of the erratic program verify-read operation that is performed at steps S6–S7 of FIG. 6 after completion of the program sequence, with reference to FIG. 10. FIG. 10 is the one that follows the program sequence shown in FIG. 9. As described above, when all the data bits (node N1 side) of the latches LATCH1 of page buffer 110 become "H" as the result of repeated execution or the program pulse application and program verify-read operations, the programming is ended. Thereafter, invert the program data held in each latch circuit LATCH2 of the cache 120; than, transfer the inverted data bits to corresponding latches LATCH1 of page buffer 110, respectively (State A2 of FIG. 10).

This data invert/transfer process is such an operation that sends the data of the node N5 of cache unit CAU toward the node N2 of page buffer unit PBU through the NMOS transistors 7 and 6. As a result, the data of the node N1 become inverse to that of the node N5. Subsequently, output the N1's data onto the bit lines selected in the programming operation (State B2 of FIG. 10). Here, as shown by State B2 in FIG. 10, outputting the node N1 data of the latch LATCH1 of page buffer 110 becoming bitline precharge. Here, in the page buffer unit which has experienced the "1" program, 0-V voltage is precharged to the bit line, since the node N5 is set at "1" and the node N1 is at "0," in the page buffer unit that has experienced "0" program, the node N1 is at "1", thereby resulting in "H" level precharge being done to the bit line.

What is to be checked here is to find whether the threshold voltage of a memory cell, that is in logic "1" state and is then subjected to "1" program, is unusually shifted toward it "0" state threshold voltage side or not. To do this, while applying the voltage Vdd to the common source line CELSRC of NAND cell block, detect whether the bit line of interest is charged up to a prespecified potential level by a negative threshold voltage of the memory cell in a similar way to an erase-verify-read operation as will be described later. Practically, apply a predefined read voltage to the selected word line while applying a read-use pass voltage Vread to the remaining nonselected word lines. Apply Vread to the select gate line. If the threshold voltage of the selected memory cell stays in a "1" state (negative threshold), the 0-V precharged bit line is charged up by a source follower operation of the memory cell, whereby a logic "H" (="1") data is read out. At this time, any bitline corresponding to "0" programmed cell is kept floating while being precharged at "H" (="1"). This is State C2 of FIG. 10.

When sensing "H" data of the bitline by the page buffer 110 and then passing the sensed data to its associative latch circuit LATCH1 for storage therein, the node N1 potentially goes high to reach "H" level (="1"). This is State D2 in FIG. 10. When the memory cell, that is expected to retain a logic "1" therein, is erratically programmed, its threshold voltage is higher than that of a normal logic "1" data cell. In this case, the voltage being precharged to the bit line becomes lower in potential. Thus, sensing it by the page buffer 10 and latching therein would result in "L" (="0") in spite of that it must be "H". Next, detect whether all of the latch data bits (data of node N1) of the page buffer 110 are at "H" (State E2 of FIG. 10). If this all-"H" status is detected, no erroneous programs are present. Otherwise, occurrence of an erroneous program or program error is found and verified.

Figure 15:
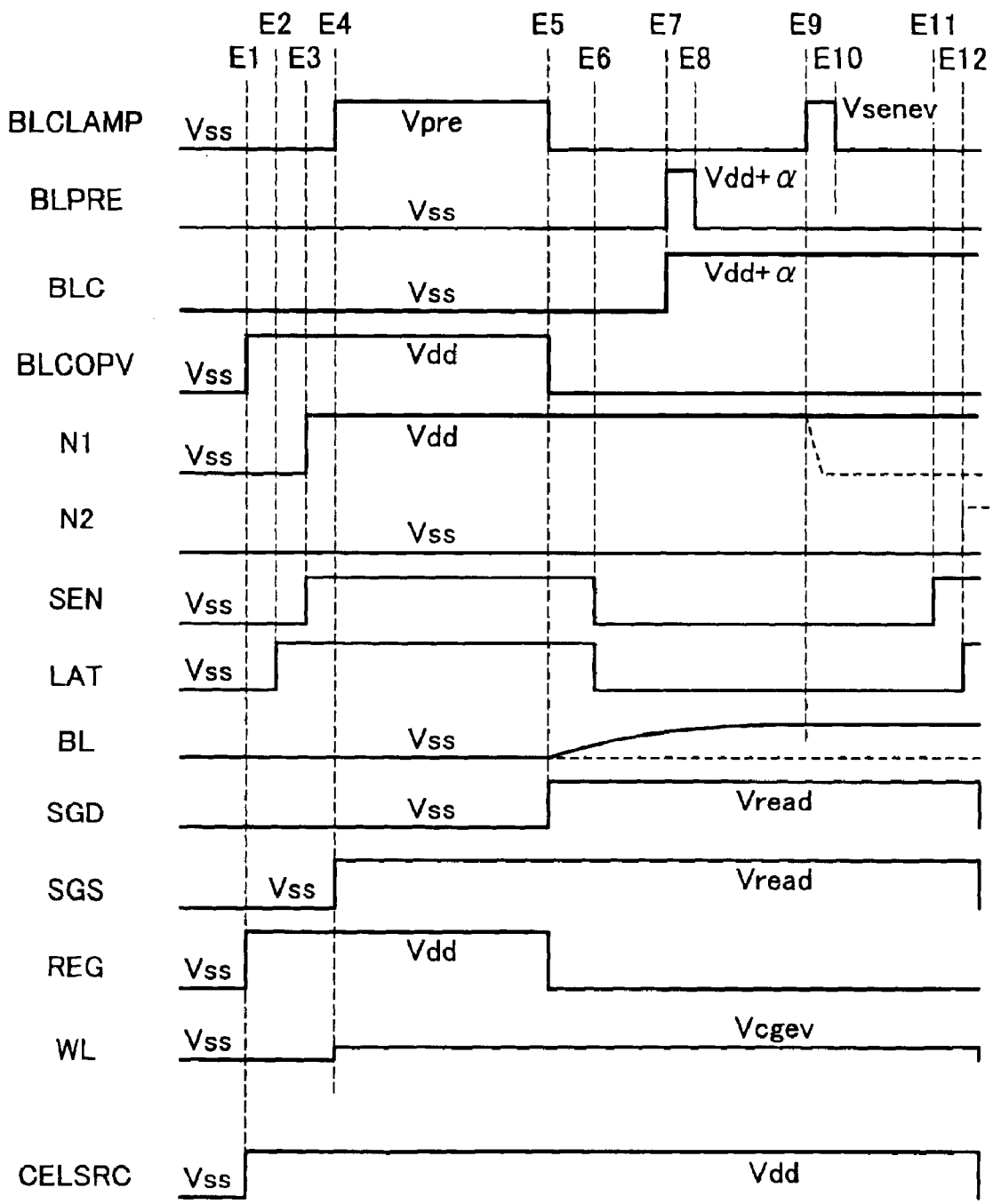
FIG. 15 is a timing diagram of a data erase verify operation.
Figure 16:
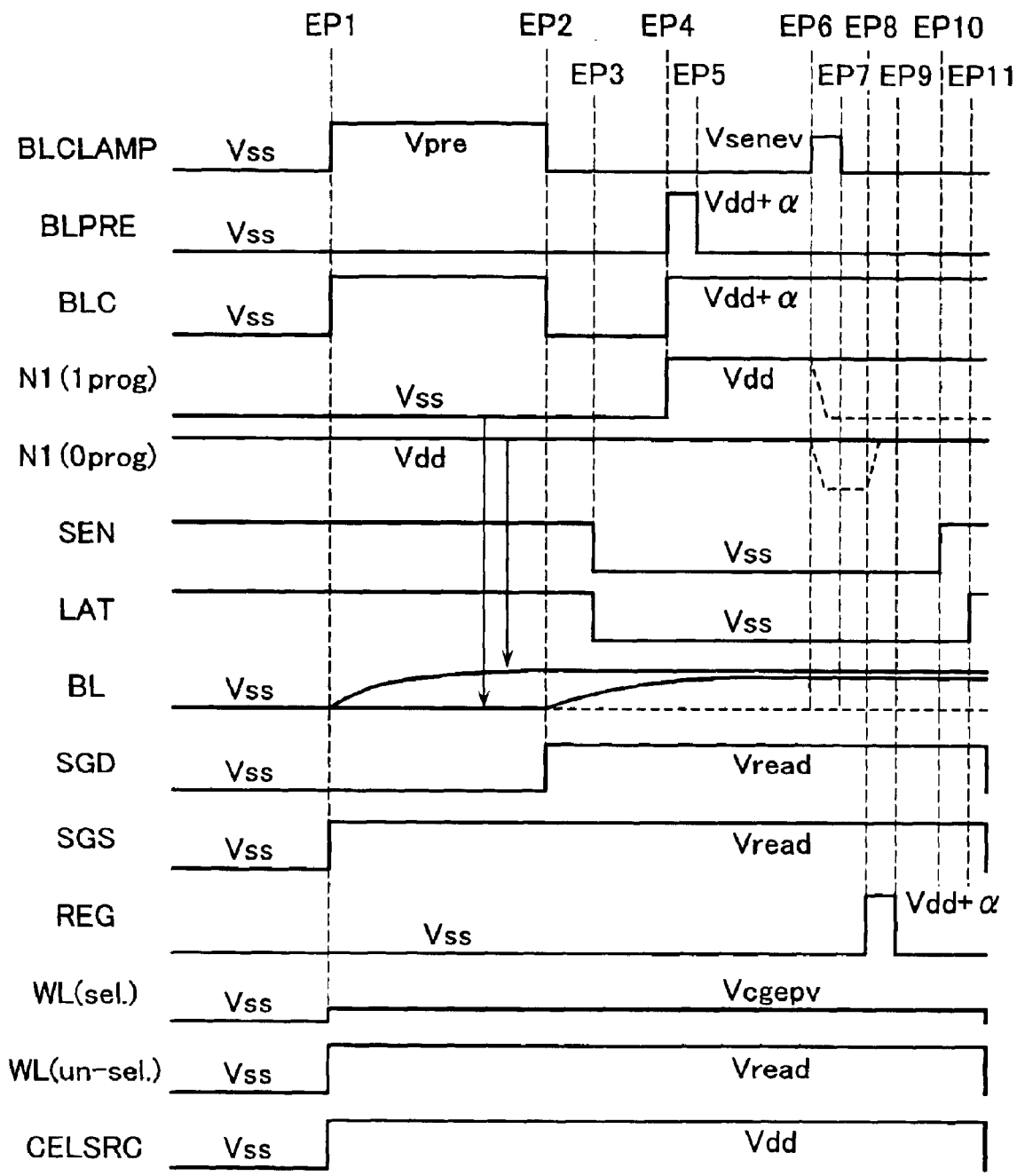
FIG. 16 is a timing diagram of an erratic program verify operation in the sequence of FIG. 6.

As apparent from the foregoing, the erratic program verify-read operation is performed by use of source-follower operation by the memory cell. This is similar to the erase verify-read operation. An operation timing chart of one practically implemented erase verify-read operation is shown in FIG. 15. An exemplary erratic program verify-read operation timing chart similar thereto is shown in FIG. 16.

Figure 20A:
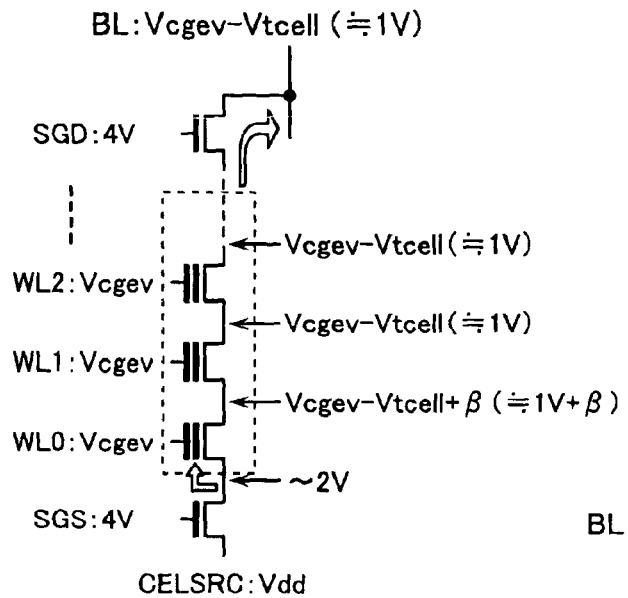
FIGS. 20A to 20C are diagrams each for explanation of a bitline charging operation by use of a cell current flowing during verify-read.

An explanation will first be given of the erase verify-read operation with reference to FIG. 15. In an erase verify-read mode utilizing the source-follower operability of a memory cell, charge a bit line to 0V and, then, charge the bit line from a source line through the memory cell which is negative in threshold voltage. A bias relationship at such time is shown in FIG. 20A.

Firstly, within a time period of from a time point E1 to time point E3, set the node N2 of latch circuit LATCH1 of the page buffer 110 at 0V. At this time, the recharger circuit 13 outputs a voltage of 0V to node N2 via NMOS transistors 6 and 12 being presently on, thereby resetting to N2=0V. Additionally, apply the Vdd voltage to the common source line CELSRC of NAND cell block.

Subsequently, for a time period between time points E4 and E5, precharge a selected bit line at 0V through the NMOS transistors 9 and 6 being driven to on-states. In addition, apply a read voltage Vcgev to all the word lines of the selected NAND cell block while applying an "H" level voltage (pass voltage) Vread to select gate line SGS, thereby charging the channel of the selected NAND cell unit. The wordline voltage Vcgev is such a voltage that is required to guarantee the threshold voltage upper limit value Vev during erasing shown in FIG. 4. For example, Vcgev is 0V.

At time point E5, stop the bitline precharging, and set the select gate line SGD of NAND cell block at "H" level (pass voltage) Vread. With this process, if the memory cell's threshold voltage Vtcell is negative, the bit line is charged up to a potential level of Vcgev−Vtcell. During erase-verify, all of the memory cells within the NAND cell unit are to verified; thus, the erase verify is passed only when the threshold voltage of all the series-connected memory cells falls within a predetermined negative range.

In a time period of from time point E6 to E8, precharge the nodes N4, N1 at Vdd. In an E9–E10 period, apply a sense voltage Vsenev to the gate of NMOS transistor 9, thereby sensing the bitline potential. At this time, if the resulting bitline potential is less than Vsenev−Vt, nodes N4, N1 becomes almost equal in potential to the bit line. In a following E11–E12 period for data acquisition, "L" level data is taken into the latch circuit LATCH1. In this case, erasing is deficient so that the erase-verify is in fail. On the other hand, if the bitline potential is higher than Vsenev−Vt, NMOS transistor 9 cuts off to hold the nodes N4, N1 to Vdd. During its following data accommodation to the latch LATCH1, "H" level data is taken thereinto. In this case the erase-verify is passed.

A detailed explanation will now be given of how the bit line is charged during the erase verify operation shown in FIG. 20A in the event that all of the memory cells have been erased. The select gate lines SGD, SGS are applied a pass voltage Vread of 4V; every word line is given a read voltage Vcgev. When Vdd is given to the common source line CELSRC, supposing the threshold voltage of the select gate transistor is 2.0V, a voltage of about 2V is transferred to the source of a memory cell driven by word line WL0 while sending a voltage of Vcgev−Vtcell+β to the drain thereof, Vtcell is the cell's threshold voltage (negative). β is a voltage resulted from rise-up of a floating gate potential due to capacitive coupling when the source-side potential is high. The value β serves to let the negative memory-cell threshold voltage be virtually deeper. Therefore, in those cells disposed between it and the bit line—say, bitline-side cells—, diffusion layers thereof are potentially clamped at Vcgev−Vtcell or therearound. This result in the voltage to be sent to the bit line BL becoming equal to Vcgev−Vtcell (about 1V).

Figure 20B:
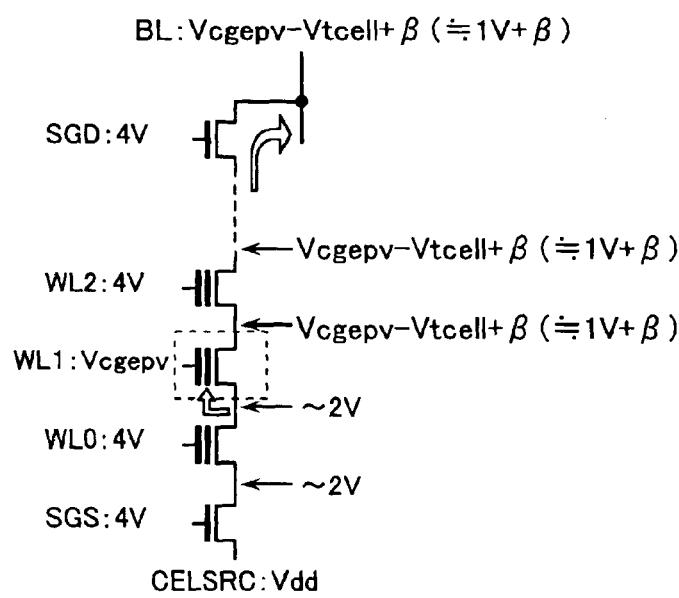

Next, the erratic program verify-read operation will be explained using FIG. 16. FIG. 20B shows a bias relationship of the NAND cell unit in this erratic verify-read operation in comparison with FIG 20A.

First, prior to the start-up of an operation to be done after a time point EP1, the inverted data has been transferred to the latch circuit LATCH1 on the page buffer 110 side from the latch circuit LATCH2 at the cache 120 in the way stated supra. Accordingly, in the page buffer unit PBU that has written logic "1" data into the "1" state memory cell the node N1 stays at a potential indicative of logic "0" data (i.e. 0V). Within a time period spanning from a time point EP1 to EP2, apply the precharge voltage Vpre to the gate of NMOS transistor 9 while at the same time applying a voltage of Vdd+á to the gate of NMOS transistor 5, to thereby charge up the selected bit line by the data presently held in the latch LATCH1 of the page buffer 110. When the node N1 is "0" data, the bit line is precharged to 0V; when N1 is "1" data, a voltage of Vpre−Vt (Vt is the threshold voltage of NMOS transistor 9) is precharged to the bit line.

Also at this time, the common source line CELSRC of NAND cell block is charged up at Vdd. In the selected NAND cell block, its select gate line SGS is potentially raised to "H" level. Therefore, NAND cell channel is also precharged to Vdd. A selected word line is applied a program-error verify-read voltage Vcgepv is a voltage which is slightly higher in potential than above-described erase verify. For example, when Vcgev is 0V, Vcgepv is set at 0.5V.

Figure 4:
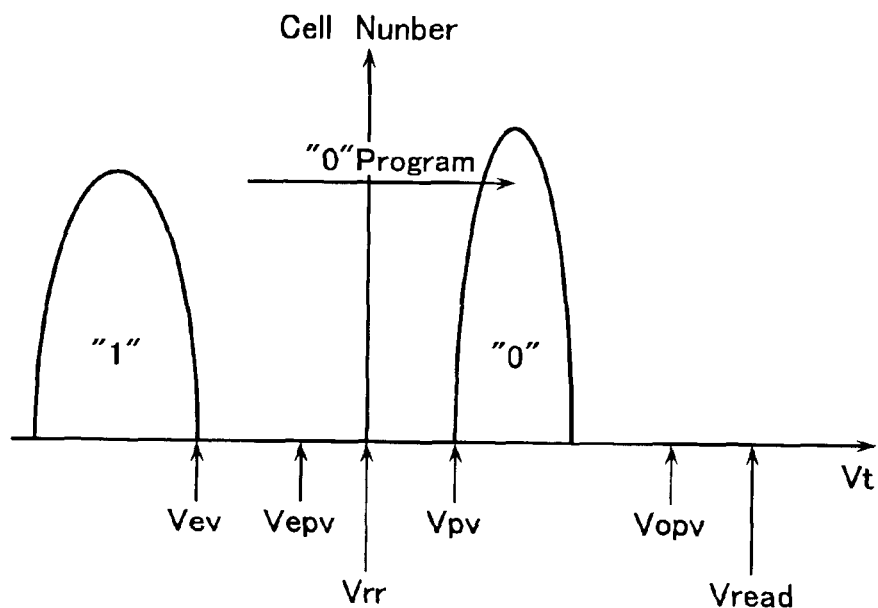
FIG. 4 is a diagram graphically showing a threshold voltage distribution pattern of memory cell data.
Figure 5:
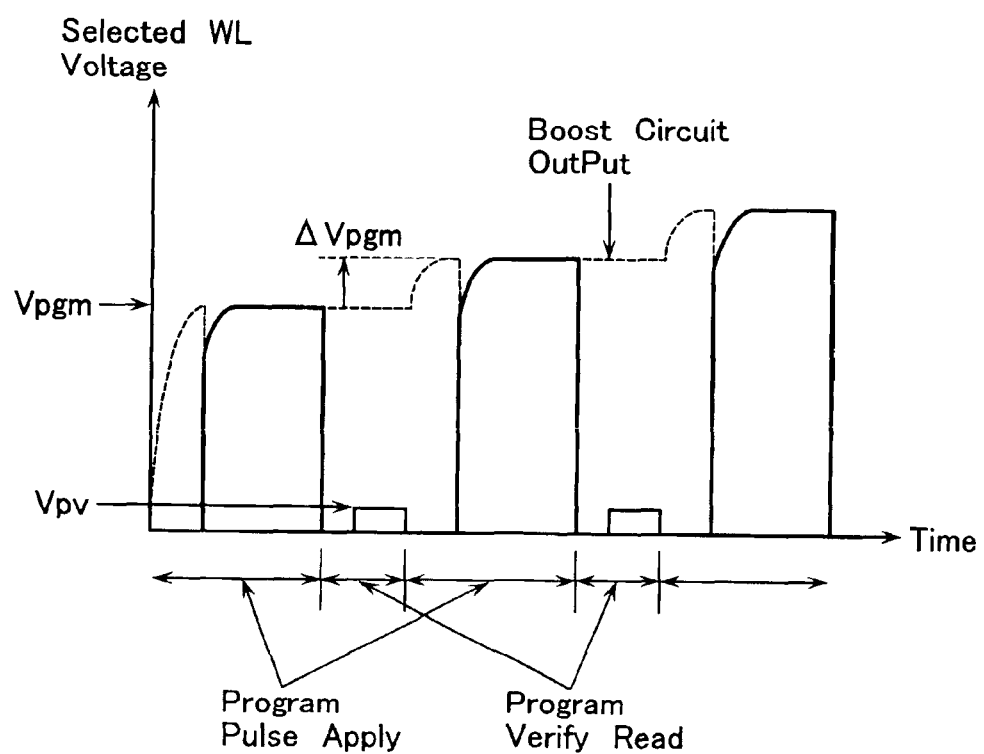
FIG. 5 is a diagram graphically showing a word-line voltage change pattern of a write operation

As shown in FIG. 4, in case the "1" state distribution is formed by an erase operation, the upper limit of the memory-cell threshold voltage as guaranteed by the erase varify operation is Vev. After weak program stress is applied to a "1" data storage cell in the program verify operation, this cell inevitably experiences a threshold voltage variation, resulting in its threshold voltage shifting toward the positive side beyond this threshold voltage upper limit Vev. Therefore, if erratic program check is done simply under the same verify conditions as in the erase verify session, it results in frequent occurrence of "Fail" events. To avoid this, apply the read voltage Vcgepv to a presently selected word line during this erratic program verify. This voltage Vcgepv is needed to guarantee the threshold voltage Vepv that is the upper limit of an allowable variation or tolerance of the erase threshold voltage distribution upper limit Vev. Note here that the threshold voltage Vepv is potentially lower than the read voltage Vrr given to the selected word line, that is a threshold voltage for differentiating a data "1" state from a data "0" state during normal reading. Apply a voltage of 4V to nonselected word lines as the pass voltage Vread, by way example.

At time point EP2 of FIG. 16, this precharging is terminated. Simultaneously, set the select gate line SGD of the selected NAND cell block at "H" level (=Vread). With this voltage application, if the threshold voltage Vtcell of the selected cell stays negative, a read current flows in the memory cell from its source toward drain, thereby causing the bit line to be charged at Vcgepv−Vtcell. If the threshold voltage if the memory cell which is to be in logic "1" data storage state was unusually shifted to the positive side, the potential charged to the bit line becomes lower.

An example of the voltage setup is that Vev is at about −1V and Vepv is −0.5V or more or less. In this case, erratic program verify is achievably, which provides a "1" state read margin of 0.5V relative to the selected wordline voltage Vrr during normal reading.

Within a time period of from time point EP3 to EP5, let NMOS transistors 5, 10 turn on to precharge the nodes N4, N1 to Vdd. Thereafter, in an EP6–EP7 period, apply a sensing voltage VseneV to the gate of NMOS transistor 9. At this time, if the selected bitline's potential is higher than Vsenev−Vt, NMOS transistor 9 is kept in a cut-off state, resulting in nodes N1, N4 being held at Vdd. In this case, "H" level is soon taken into the latch LATCH1, resulting in the erratic program verify being in the "Pass" state. In contrast, if the selected bit line's potential is lower than Vsenev−Vt, NMOS transistor 9 turns on to cause nodes N4, N1 to be discharged and become almost equal to the bitline potential. This later permits accommodation of "L" level in the node N1 of latch LATCH1, resulting in the erratic program verify being in the "Fail" state.

During this erratic program verify session, with respect to the page buffer unit PBU which effectuated "0" writing, the selected bitline is kept in a floating state at the precharged level of Vpre−Vt because of that the bitline charge-up from the memory cell is no longer available. This can be said because the threshold voltage of any "0"-written memory cell stays at a positive value and thus it never turns on in response to application of the gate voltage of Vcgepv. In this erratic program verify, "0"-programmed cells are not required to be checked, and are required to be passed without fail. Therefore, drive NMOS transistor 12 to turn of within an EP8–EP9 period, forcing nodes N4, N1 to be set at "H" level by recharger circuit 13.

The recharge circuit 13 recharges the node N4 in this way whenever the data appearing at the node N1 up to time point EP3 is "H."

When the potential of node N1 is settled in the latch LATCH1 within a time period of from instant EP10 to EP11, if the node N1's potential is at "H" level in every page buffer unit PBU concerned, then the entire erratic program verify result becomes "Pass."

As previously stated, this embodiment is arranged to employ the cache 120 which continuously retains therein the externally supplied "rare" program data in addition to the page buffer 110 in which the program data is loaded and which causes a data bit or bits at part corresponding to a sufficiently programmed cell(s) to be inverted during very-reading. And, collating the data held in this cache 120 with the data actually programmed into the memory cells makes it possible to achieve the intended program verify for accurate detection of any possible improperly programmed bits, also called program error bits.

In the control flowchart of FIG. 6, the on-chip system routine ends with execution of only the erratic program verify operation after completion of a program operation. In this operation control routine of FIG. 6, the process covering up to the erratic program verifying is carried out in an automated way in response to receipt of an execution command accompanying the erratic program verify. To this end, the ready/busy register 401 in the status register module 400 of FIG. 1 is designed to generate and issue at its output a flag signal which indicates that the flash EEPROM chip embodying the invention is in the "busy" state within a time period spanning from the beginning of the program operation up to the termination of its following erratic program verify operation. The status register 400 also includes other status information handleable registers, such as the program status register 402 which outputs a flag indicative of whether a program operation is "Pass" or "Fail," and the erratic program status register 403 that outputs a flag indicative of whether an erratic program verify operation is "Pass" or "Fail." By separating the program pass/fail information from the pass/fail information available during erratic program verifying in this way, it becomes possible to judge whether "Fail" occurs due to improper execution of the program operation or due to the presence of an erroneous program in spite of proper execution of the program operation per se.

Embodiment 2

An explanation will next be given of another embodiment 2 which is arranged to perform an over-write or over-program verify operation in addition to the erratic program verify operation of the above-noted Embodiment 1. Embodiment 2 is similar in flash memory configuration to Embodiment 1.

Figure 7:
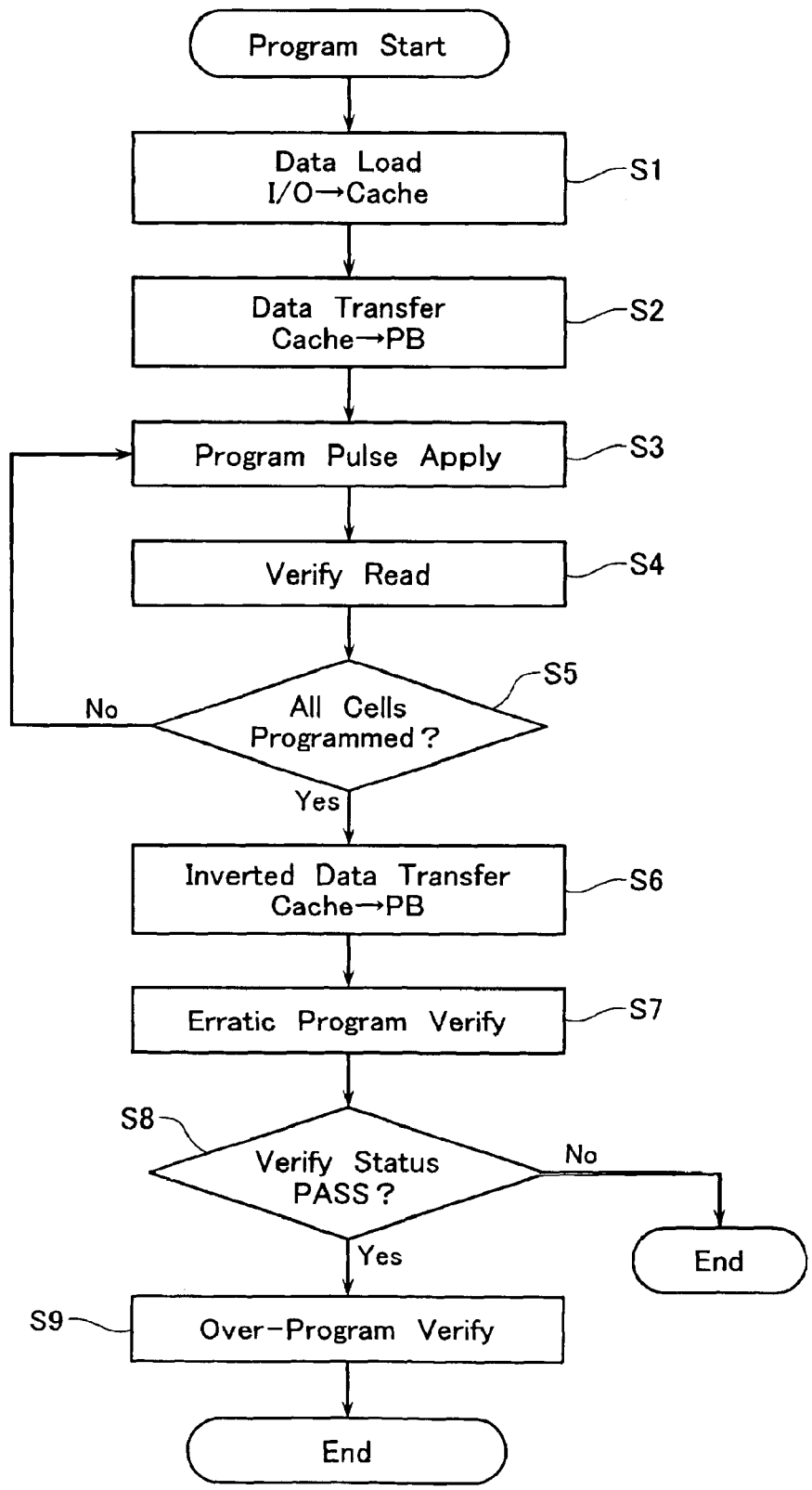
FIG. 7 is a flow chart showing a procedure for control of a program operation including erratic program verify and over-program verify processes.

FIG. 7 is a flowchart of an on-chip system routine for operation control, including the over-program verify in this embodiment. This system routine is similar to that of Embodiment 1 in several process steps covering from data load step S1 up to erratic program verify step S7.

After having performed the erratic program verify operation at step S7, the routine goes to step S8 which checks the data presently held in the page buffer 110 to determine whether an erratic program verify result is "Pass" or not. Recall that "Pass" is set when all data at the node N1 is at "H." Thus, if Yes at step S8, then the routine proceeds to step S9 which effectuates over program verify. If No at step S8, that is, when more than one "failed" data bit is found during the erratic program verify, the entire program operation may be ended.

Figure 11:
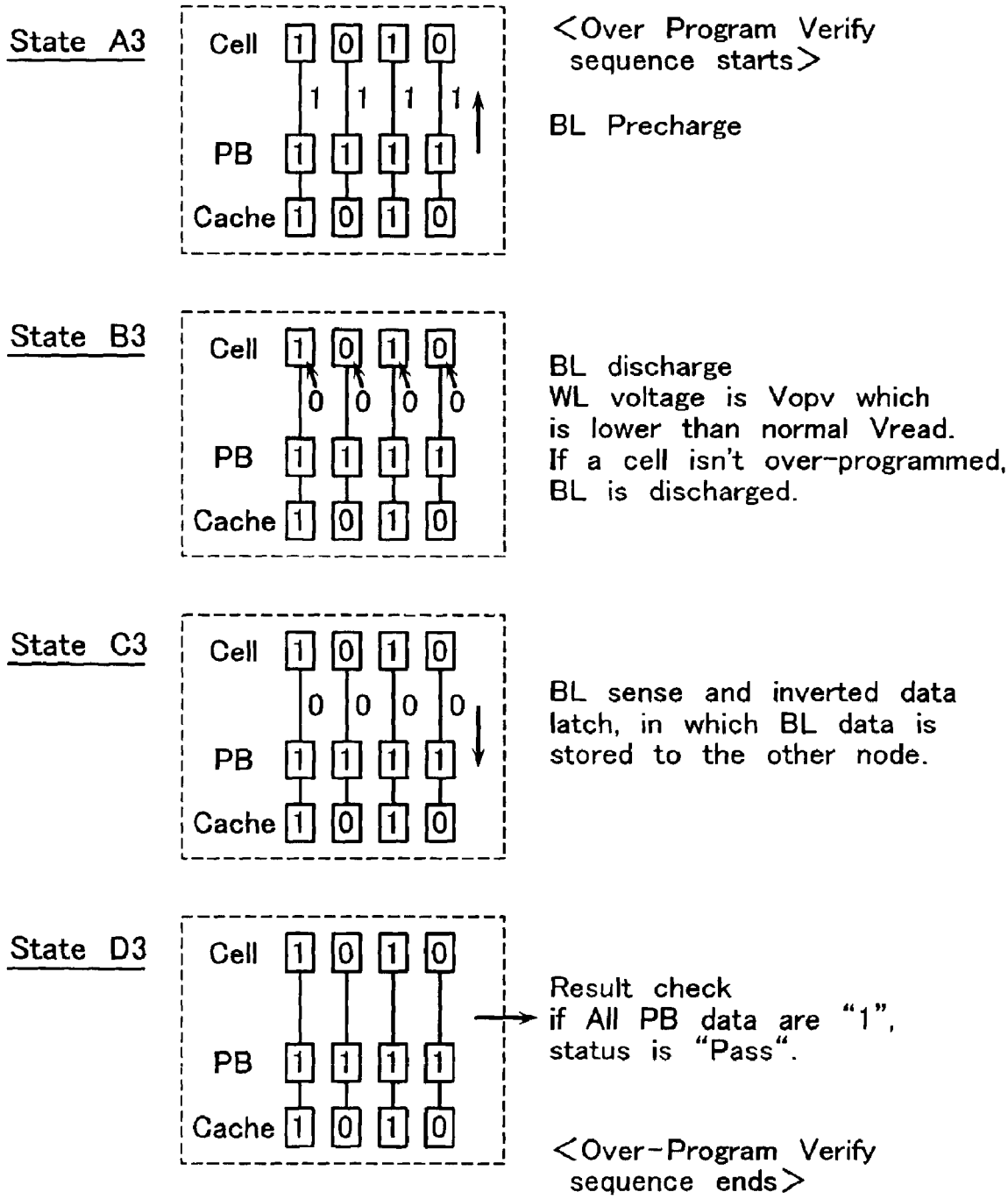
FIG. 11 is a diagram showing changes of the page-buffer/cache data and the cell data in an over-program verify sequence after an erratic program verify sequence.

Data change patterns during the over-program verify operation are shown in FIG. 11. This verify-read is done in a similar way to the normal road operation: precharge selected bit lines at a certain voltage as shown logic "1" (see State A3 of FIG. 11); thereafter, apply a read voltage Vopv to a selected word line (State B3 in FIG. 11), which voltage is slightly lower in potential than the pass voltage Vread used during normal reading. This read voltage Vopv is the upper limit value of "0" data threshold voltage which allows over-programming. Preferably, voltage Vopv is set at a value which is higher than a predicted upper limit of the write distribution and yet slightly lower than the pass voltage Vread. The reason why Vopv is set to be lower than Vread is to aim at provision of a margin of the threshold voltage after "0" program with respect to Vread.

After completion of writing, if the threshold voltage of a "0" programmed memory cell is controlled to less than a predefined distribution width, the memory cell turns on on receipt of the read voltage Vopv to cause a read current to flow from its drain to source, which results in its associative bit line being discharged. Thus, if the cell is normal, the bitline potential becomes "L" level. The check after the over-program verify includes determining whether the node N1 of latch LATCH1 of the page buffer 110 is "H" or not to thereby find an over-program. To this end, perform the bitline potential sensing and latching operation at a node which is on the opposite side to the node used during normal reading, i.e. at node N2 (see State C3 of FIG. 11). And, determine whether any over-program is present or absent, depending on whether all the nodes N1 of latches LATCH1 are "1" (="H") or not (see State D3 in FIG. 11). In the all—"1" event, the over-program verity is "Pass."

Figure 17:
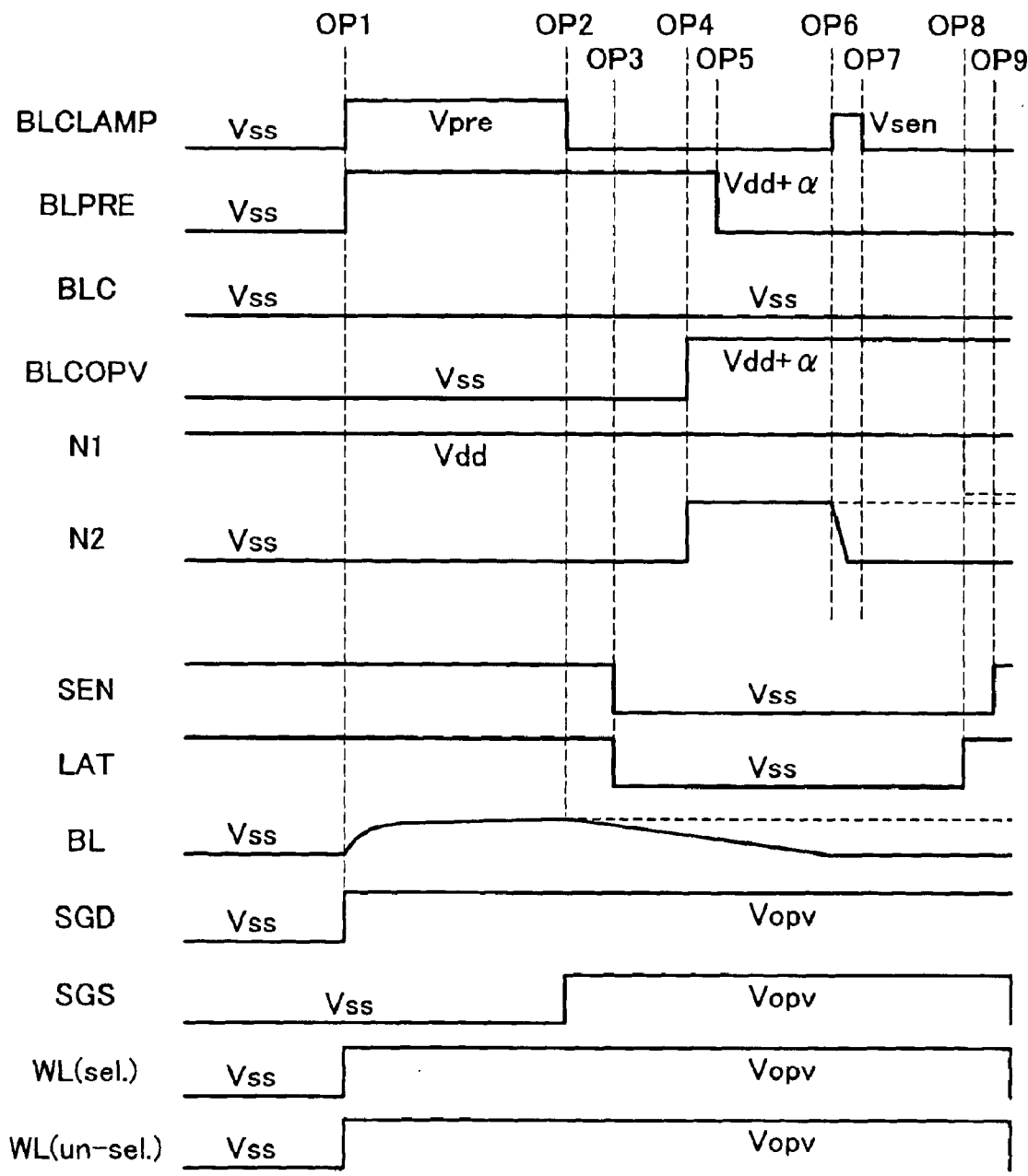
FIG. 17 is a timing diagram of an over-program verify operation in the sequence of FIG. 7.

FIG. 17 is a timing diagram if the above-stated over-program verify-read operation. Within a time period between time points OP1 and OP2, drive NMOS transistors 9, 10 to turn on to thereby precharge a selected bit line at a potential level of Vpre–Vt. At time point OP1, apply a verify-read voltage Vopv to a selected word line and non-selected wordlines along with the drain-side select gate line SGD. The verify-read voltage Vopv is little lower than the pass voltage Vread used during reading. At time point OP2, terminate the bitline precharging; simultaneously, set the source-side select gate line SGS of a selected NAND cell block at "H" level of Vopv, causing bitline discharge to be done by NAND cell units.

At time point OP3, let the latch LATCH1 on the page buffer 110 side be off. At time point OP4, turn on NMOS transistor 6 in response to a signal BLCOPV, thereby pre-charging nodes N4, N2 to Vdd. In a period between time points OP6 and OP7, apply a sensing voltage Vsen to the gate of NMOS transistor 9 to sense the bitline potential. If the bitline potential is less than or equal to Vsen–Vt, since NMOS transistor 9 is rendered conductive, nodes N4, N2 become almost identical in potential to the bit line. In contrast to this, if the bitline potential is higher than Vsen–Vt, since NMOS transistor 9 does not turn-on, nodes N4, N2 are potentially held at or near Vdd. In an OP8–OP9 period, let the node N2 potential be taken into latch LATCH1.

After having done the over-program verify in this way, check the data bits (at nodes N1) of latches LATCH1 on the page buffer 110 side. If these read data bits are all "1" (="H"), the following is ensured: over-program is absent in the selected cells during programming: and, the threshold voltage of the "0" programmed cell is capable of turn-on upon receipt of the pass voltage Vread during normal reading. Whereby, the over-program verify is "Pass." If "L" data bit is found, its corresponding memory cell has been over-programmed so that "Fail" is get.

Although the verify-read voltage Vopv is applied to the select gate lines SGD and SGS, selected wordline and non-selected wordlines in FIG. 17, it is a mere example. For example, another preferable voltage application condition in the over-verify read operation may be set as follow: the select gate lines SGD, SGS and the non-selected wordlines are applied the pass voltage Vread used in the normal read operation; and the selected wordline is applied the verify-read voltage Vopv.

The operation control sequence of FIG. 7 is performed automatically by the controller circuit 300 in responding to receipt of an execution command accompanying the erratic program verify and ever-program verify. In the process of execution of such operations, the flash memory chip outputs a status signal indicating that it is in a busy state.

Additionally, the status register 400 outputs flag signals which indicate the pass/fail of program operation, pass/fail of program error verify, and pass/fall of over-program verify, respectively.

Embodiment 3

Figure 18:
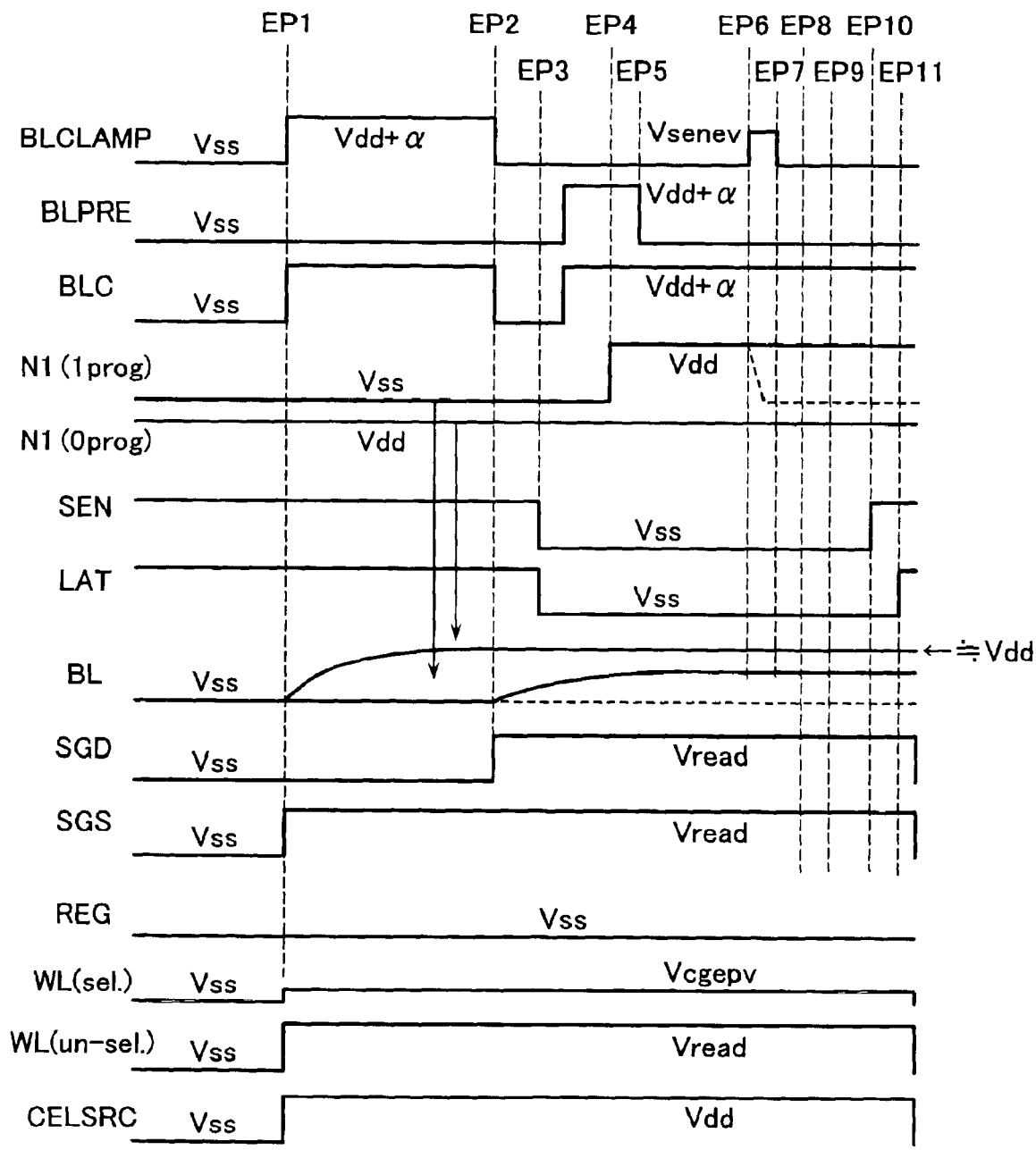
FIG. 18 is a timing diagram of another erratic program verify operation.

FIG. 18 is a timing diagram of an erratic program verify operation which is little different from that of FIG. 16. In the flow of FIG. 16, the gate voltage BLCLAMP of the clamping NMOS transistor 9 is set at Vpre during bitline pre-charging and at Vsenev (<Vpre) during bitline sensing. Vpre is the same as the voltage used for precharge during normal data read shown in FIG. 13.

When a memory cell needless to be checked during erratic program verify—namely, the node N1 of latch LACTH1 within the page buffer 110—is at "H" (=logic "1" data), the bitline-applied precharge voltage is made equal to Vpre-Vt; during sensing, whether the bitline potential is higher or lower than Vsenev–Vt is the reference for logical judgment. In the pulse signal waveforms during the operation of FIG. 16, the recharge circuit 13 performs recharging of the nodes N4, N1 within the time period between time points EP8 and EP9 in order to avoid unwanted accommodation of the "L" level data to nodes N4, N1 in the case of Vpre–Vt<VseneV–Vt, which data will be "Fail" as the result of the erratic program verify.

In contrast, the timing chart of FIG. 18 such that the gate voltage BLCLAMP of NMOS transistor 9 is potentially raised to Vdd+á (á is equivalent to the threshold voltage Vt) higher than during bitline precharging within a time period of from instant EP1 to EP2. This results in the potential of the bitline-precharged "H" level being set at about Vdd. In this read method, since the source line CELSRC is set at Vdd, the bitline precharged level, Vdd, is held approximately as it is until when the bitline potential is sensed. Therefore, the while bitline potential is sensed in the EP6–EP7 period, since the gate of NMOS transistor 9 is Vsense, and node N4 and bitline are Vdd, NMOS transistor 9 is not turned-on. Thus, the nodes N4, N1 associated with an erratic program verify check-free memory cell potentially goes to Vdd, thereby ensuring reliable settlement of data "H" passable by the erratic program verify. Due to this, it is no longer required to perform recharging of nodes N4, N1 in an EP8–EP9 period.

Embodiment 4

As explained in FIG. 20B, the erratic program verify schemes of FIGS. 16 and 18 are arranged to use the memory cell's source-follower operation to output a voltage equivalent to the negative threshold voltage of the memory cell onto its associated bit line to thereby perform the intended data readout. During erase-verify, erase is done in units of cell blocks, each having a plurality of NAND cell units; for this reason, every memory cell within a presently selected NAND cell block is subjected to verifying. Thus, as shown in FIG. 20A, the read voltage Vcgev for erase verify is applied to word lines of all the memory cells.

On the other hand, the erratic program verify is done by first performing programming to a certain selected word line and then performing a verify-read operation relative to those memory cells associated with the selected word line. In FIG. 20B, while a word line WL1 is selected, a read-use pass voltage Vread (for example, 4V) is applied to nonselected word lines WL0 and WL2. Accordingly, in a strict sense, the within-NAND-cell bias conditions are different from those during the erase-verify operation.

A detailed explanation will be given while comparing the bias relationship of FIG. 20A to that in FIG. 20B. In an erase verify session, a voltage of about 2V is transferred to the sources line CELSRC side of word line WL0 while a voltage of Vegev−Vtcell+β is sent to the bitline BL side. Furthermore, a voltage of Vcgev−Vtcell is passed to the bitline BL side of word lines WL1 and WL2. As previously stated, β is a capacitive coupling-created potential rise-up component of the voltage of word lines WL0 from 2.5V as sent to the source of a cell. For the remaining word lines WL1–WL2, the cell's source side potential becomes lower so that influence of such capacitive coupling becomes negligible. Thus, the voltages that the respective cells transfer to bitline side thereof becomes about Vcgev−Vtcell.

In contrast, during erratic program verify, as shown in FIG. 20B, when the word line WL1 is selected, a voltage of about 2.5V is transferred to the source of the selected cell because the nonselected word lines WL0, WL2 are sufficiently high in potential; thus; a voltage appearing at its drain is given as Vcgepv−Vtcell+β. As a high voltage of 4V is given to word line WL2 also, a voltage of Vcgepv−Vtcell+β is finally sent to the bit line. The influenceability of β is determined depending upon several parameters including, but not limited to, the shape of memory cell, select gate SGS's potential, and the read-use pass voltage of nonselected word lines.

Accordingly, comparing between FIGS. 20A and 20B, the bitline voltage of FIG. 20B gets higher even when the memory cell of interest is kept unchanged in threshold voltage. This means that the erratic program verify is less strict in read condition than the erase verify. In other words, even if the threshold voltage of "1" storage state greatly shifts or offsets in the positive direction, the possibility of "Pass" tends to increase during erratic program verify.

Figure 20C:
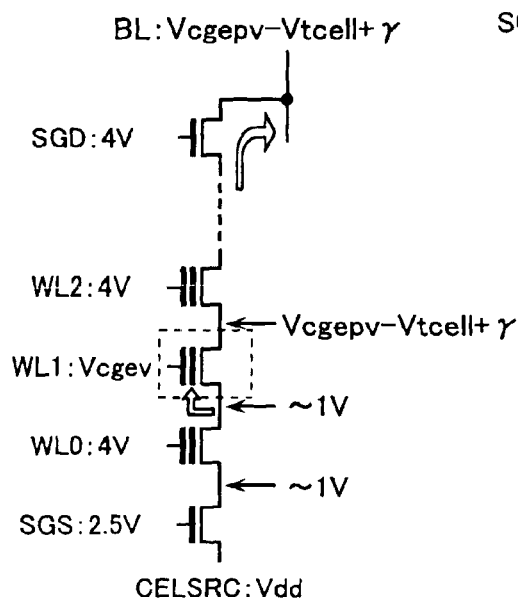

Another examplary bias relationship in the erratic program verify operation which takes the above points into consideration is shown in FIG. 20C in a way corresponding to FIG. 20B. In this example the voltage applied to the select gate line SGS on the common source line CELSRC side is set at a potential level slightly lower than the pass voltage Vread=4V; for example, 2.5V. With this voltage setting, supposing that the voltage being transferred to the source side of a memory cell associated with the selected word line WL1 decreases to about 1V, above-described influence of the capacitive-coupling between the floating gate and the source/drain becomes more negligible. In short, the voltage being sent to the bit line BL is finally at Vcgcpv−Vtcell+γ, where γ is a potential increment less than β. Thus it is possible to substantially lower the threshold voltage used for write-error-verify determination.

A way for designing the pass voltage applied to the select gate line SGS is to suppress the voltage transferred from the common source line CELSRC to the drain of a select gate transistor so that this voltage is equivalent to the voltage within a NAND cell channel (i.e., bitline voltage) during erase-verify. Preferably, let this select gate line SGS's voltage be a potentally adjustable or "tunable" voltage. Whereby, it becomes possible to achieve optimization of the read operation condition, and then a preferable erratic program verify may be achieved.

Embodiment 5

Although the erratic program verify schemes discussed with reference to FIGS. 16 and 18 are arranged to employ the memory-cell source follower-based read technique similar to that used in erase-verify sessions, similar results are also attainable by use of verify-read schemes similar to ordinary or standard read schemes which cause a read current to flow from the bitline side to the common source line side. An operation control flow used in this case is principally similar to that shown in FIG. 6. A difference therebetween lies in verify-read operation conditions or criteria for the data transfer at step S6 of FIG. 6 and the erratic program verify read at step S7.

An example of how data bits change in logic level during this erratic program verify operation is shown in FIG. 12 in a way corresponding to FIG. 10. Its related operation timing chart is shown in FIG. 18 in a way corresponding to FIG. 19. A difference of Embodiment 5 from Embodiment 1 lies in the data transfer (at step S6 of FIG. 6) and erratic program verify read operation (step S7) after completion of loop including the program pulse application and program verify operations at steps S3–S5. First, in a data transfer event, simply transfer, without inversion, the program data bits being presently stored in the latches LATCH2 of cache 120 toward their associated latches LATCH1 of page buffer 110 (see State A4 of FIG. 12). In brief, in the circuitry of FIG. 3, the data of node N5 is sent to node N1.

Subsequently, precharge all of the selected bit lines using the data of the latches LATCH1 (see State B4 of FIG. 12); thereafter, let the bit lines be discharged by memory cells (State C4 in FIG. 12). At a "1"-programmed memory cell, if its data bit stays in "1" state, then a cell current flows from its drain to source, discharging a bit line associated therewith. At a "0"-programmed cell, its associated bit line is kept at 0V from the beginning in a way corresponding to "0" data of latch LATCH1. Thereafter, bitline read data bits are inverted and then stored in the page buffer 110 (State D4 of FIG. 12). More specifically, sense a bitline potential at the opposite side node N2 of latch LATCH2 and them store it in latch LATCH1. Then, determine whether the data bits of page buffer 110 are all at "1." If all "1" then the erratic program verify is found to be "Pass" (State E4 in FIG. 12).

Figure 19:
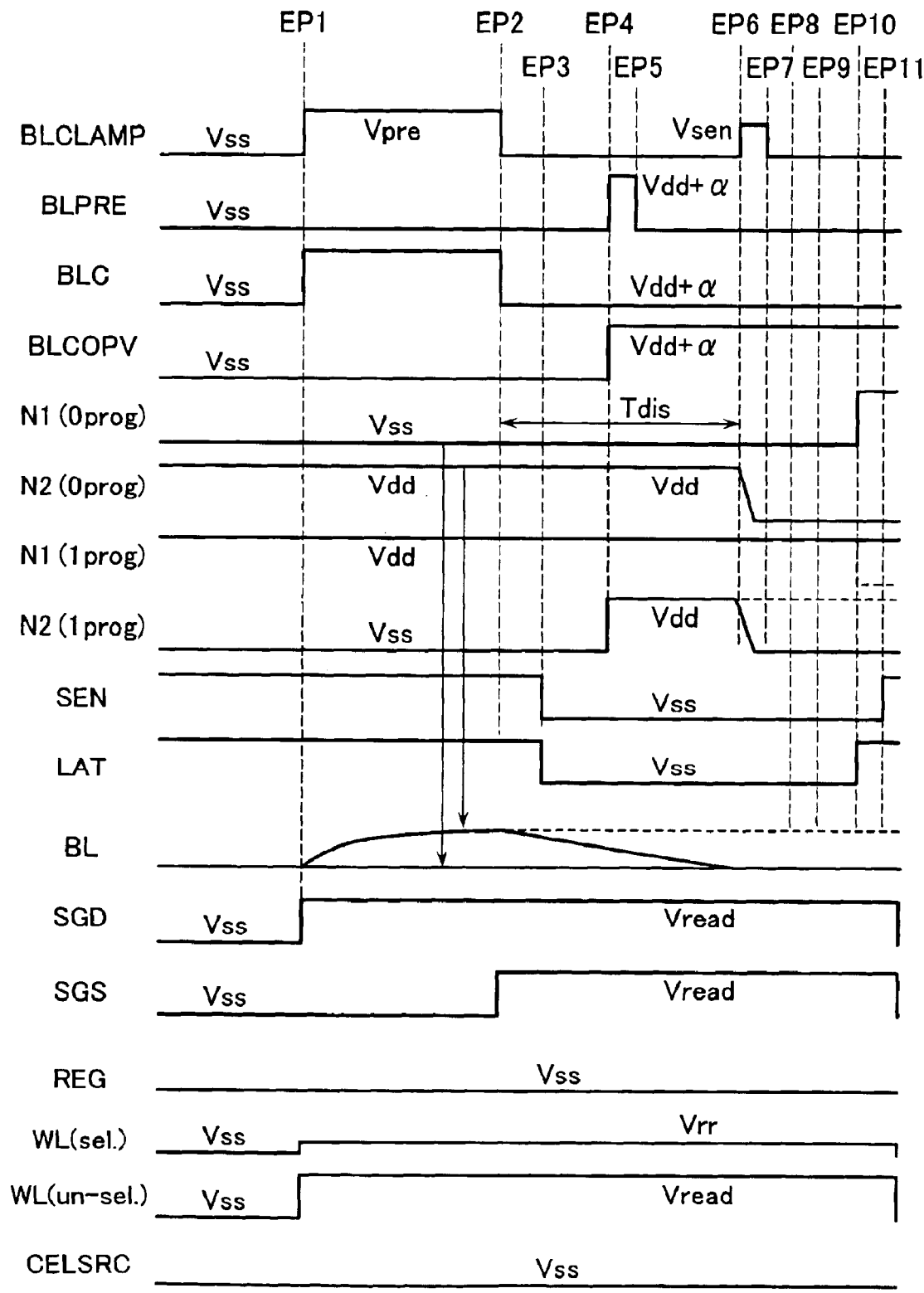
FIG. 19 is a timing diagram of still another erratic program verify operation.

A detailed explanation of the operation timing of FIG. 19 is as follows. Within a time period between instants EP1 and EP2, perform selective bitline precharging by the originally programmed data as settled in the latch LATCH1. Specifically, in the page buffer unit that performed "1" program to a "1" state memory cell, precharge its associated bit line at Vpre−Vt. This becomes an object to be erratic program verified. In the page buffer unit that performed "0" programming, precharge its bit line-at 0V. At this time, the bitline-side select gate line SGD and non-selected wordlines are at the pass voltage Vread. Apply the same read voltage Vrr as that used during normal read to a selected word line; apply 0V to the source line side select gate line SGS.

At time point EP2, stop the bitline precharge; simultaneously, set the source line-side select gate line SGS of NAND cell block at "H" level (=Vread) to thereby perform bitline discharge by the memory cells. If the "1" state memory cell of interest continues to stay at "1" state, then its associated bit line is rapidly discharged. In a period between time points EP3 and EP5, apply a voltage BLPRE (=Vdd+á) causing NMOS transistor 10 to turn on while applying BLOPV=Vdd+á causing NMOS transistor 6 to turn on, thus precharging nodes N4 and N2 at Vdd. In the following EP6–EP7 period, set the gate voltage BLCLAMP of NMOS transistor 9 at Vsen. With such voltage application, if a bitline potential is lower than Vsen–Vt, NMOS transistor 9 turns-on, then corresponding nodes N4, N2 potentially drop down at a specific level which is almost the some as the bit line. If this is the case, the erratic program verify is "Pass." In contrast, if an erroneously programmed cell is found resulting in its bit line being higher in potential than Vsen–Vt, corresponding nodes N4, N2 are held at about Vdd. In this case the erratic program varify is "Fail." In EP10–EP11 period, let this data be settled in latch LATCH1.

With this read scheme, the read voltage Vrr of a selected word line is the same as that used during normal reading; for example, 0V. To guarantee the availability of a negative threshold voltage Vepv during the erratic program verify-read using the read voltage Vrr=0V that is the same as that during normal read, shorten a bitline discharge time period Tdis which spans from time point point EP2 to EP6 of FIG. 19. With such an arrangement, it is possible to guarantee the negative threshold voltage Vepv that is the upper limit value of a threshold voltage variation due to an erratic program of "1" data while providing a margin relative to the normal read voltage Vrr, as shown in FIG. 4.

In such a case that the threshold voltage Vepv used for erratic program verify is set at zero or a positive value, the verify-read procedure is simpler. More specifically, when the read voltage Vrr of a selected word line during normal reading and the "1" data threshold voltage variation upper limit value Vepv are set to satisfy the relationship of Vrr>Vepv≧0V, set the erratic program verify-read voltage at a value equivalent to Vepv lower than Vrr; then, use it to perform a verify-read operation. With this technique, it is possible to guarantee the threshold voltage Vepv of zero or a positive value that is the upper limit value of a threshold voltage variation due to the erratic program of "1" data while attaining a margin relative to the normal read voltage Vrr.

Embodiment 6

Although the above-stated embodiments are drawn to the cases where the erratic program verify and/or over-program verify operation is performed in a way proceeding the program pulse application and program verify operations, this invention should not be limited only to these specific operation control sequences. For example, while the program data is held in latch circuitry (i.e. latch LATCH2 of cache 120), it is possible to perform only the erratic program verify operation at a given timing in response to receipt of an appropriate command.

In addition, the erratic program verify operation is done based on the data being held in the latch LATCH2 of cache 120. Accordingly, it is also possible to perform only the erratic program verify by command start-up techniques while inputting desired data from an external input/output terminal to latch LATCH2. More specifically, the intended erratic program verify is achievable independently of any program cycle in a way which follows: externally input "1" data to a latch LATCH2 together with address data for selecting memory cells to be verified; then, execute the erratic program verify with respect to the memory cells at the specified address.

Embodiment 7

Using an operation control scheme which recurrently performs the system routine of FIG. 7 that contains erratic program verify and over-program verify processes after completion of a program operation, it to possible to achieve practical implementation of an on-chip page-copy operation.

Figure 8:
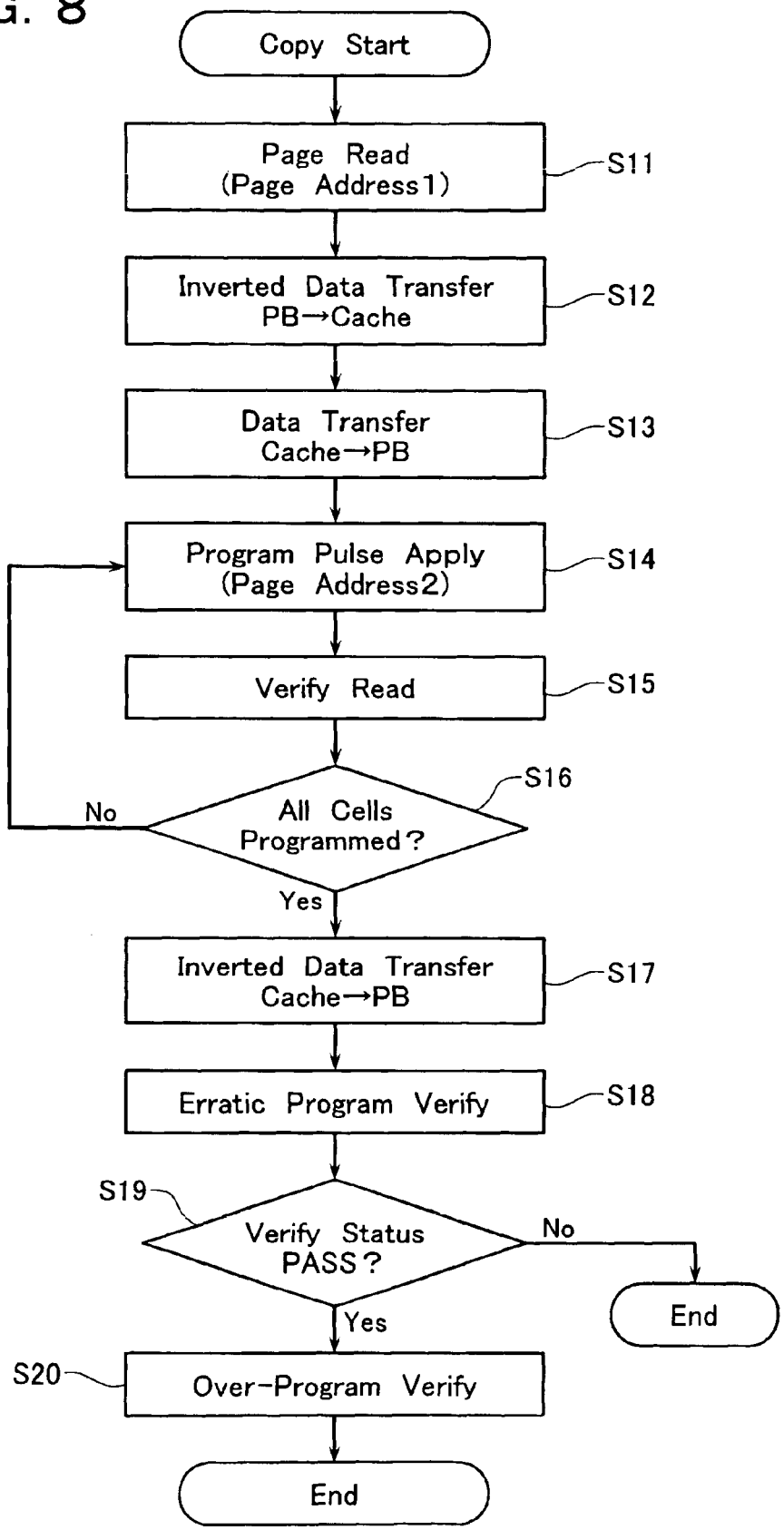
FIG. 8 is a flowchart showing a system routine for control of an on-chip page copy operation.

An exemplary system routine for the on-chip page copy operation mode is shown FIG. 8 in flowchart form. This routine starts with stop S11, which reads data out of a copy-source page of flash memory at a presently designated address 1. At this step S11, data readout is ordinarily done at the timing stated in conjunction with FIG. 13, causing the read data to be sent and held in the latch LATCH1 of page buffer 110. The routine goes next to step S12 which inverts the read data and then transfers the inverted data to the latch LATCH2 in cache 120 in order to convert the read data to program data. In the circuitry of FIG. 3, this inverted data transfer is done by driving the NMOS transistors 6–7 to turn on simultaneously, and setting the clocked inverter of latch LATCH2 in its high impedance (H1Z) state to send the data of node N2 of latch LATCH1 to latch LATCH2 for storage therein.

With this procedure, data to be next programmed is temporarily held in the latch LATCH2 so that the resulting state is similar to that of Embodiment 2. Thereafter, the routine proceeds to step S13 of FIG. 8 which transfers the data stored in latch LATCH2 toward the latch LATCH1 in page buffer 110. Then, the routine goes to step S14 which performs a program pulse application operation, followed by step S15 which effectuates a verify-read operation and also step S16 which performs a verify operation to determine if all of the cells are programmed. The operations at steps S14–S16 are done with an address 2 of a copy destination being selected. Details of these steps are similar to those of Embodiment 2 so that any further explanation thereon is eliminated herein. The following steps of routine of FIG. 8—that is, data transfer step S17, erratic program verify step S18, verify determination step S19, and over-program verify step S20—are similar to the corresponding steps S6–S9 in FIG. 7.

Whenever the erratic program verify and/or the over-program verify Is completed, if the status flag is indicative of "Fail", change the page address 2 of such copy destination by an external controller (not shown) to thereby program the memory cells of the changed page address. In NAND flash memories, a program operation is done on a per-page basis while erase is done in units of NAND cell blocks, each having a plurality of pages. When copying a plurality of pages of a certain cell block into multiple pages of a different block, the copy-programming of a page selected from among these pages can lead to failure of the erratic program verify and/or over-program verify results. If this is the case, interrupt the copying of other pages to such "failed" copy destination block also. Change the copy destination block to another; then, restart copying relative to multiple pages.

In the case of occurrence of "Fail" events during the copy-writing operation, if these are due to failures of the erratic program verify and/or over-program verify, they must be due to the lack of any sufficient margins resulted from execution of their respective verify-read operations. This is determinable depending on the outputs from the status register 400 of FIG. 1. For this kind of failures, erase is again performed followed by programming, thereby increasing the possibility that the copy operation is passed.

Alternatively, if the copy-program failures are due to the program verify, in other words, when any intended program is not attained even after the program pulses are repeatedly applied a maximal number of times, the cell array may contain therein critical defects. If this is the case, a need is felt to handle such a region subjected to the copy-program as an out-of-use region. In this case, a controller external to the flash memory chip is expected to take corrective measures.

It has been stated that according to this invention, it is possible to provide the nonvolatile semiconductor memory device with enhanced erratic program/over-program verifying functionalities.

What is claimed is:

1. A non-volatile semiconductor memory device comprising:
   a memory cell array in which electrically erasable and programmable memory cells are arrayed, each of said memory cells storing therein a first logic state with a threshold voltage lower than or equal to a first value or a second logic state with a threshold voltage higher than or equal to a second value that is higher than said first value;
   a data hold circuit for holding program data to be programmed into said memory cell array, said data hold circuit also functioning as a sense amplifier circuit for sensing data as read out of said memory cell array; and
   a controller configured to control a program sequence for said memory cell array, wherein said controller has the control functions of:
   a program control function for applying, based on said program data loaded into said data hold circuit, a program voltage to a selected memory cell of said memory cell array to let the data shift from said first logic state to said second logic state;
   a program verify control function for reading the data programmed into said memory cell array and for verifying that the programmed data of said selected memory cell shifted to said second logic state;
   an erratic program verify control function for reading the data programmed into said memory cell array and for checking that the threshold voltage of a memory cell to be held in said first logic state does not exceed a third value set as an upper limit value of a variation of said first logic state; and
   an over-program verify control function for reading the data programmed into said memory cell array and for checking that the threshold voltage of said selected memory cell shifted to said second logic state does not exceed a fourth value set as an upper limit thereof.

2. The non-volatile semiconductor memory device according to claim 1, wherein said data hold circuit includes:
   a page buffer having first latch circuits for holding read and program data corresponding to one page of said memory cell array; and
   a cache having second latch circuits each being data-transferably connected through a transfer gate to a corresponding one of said first latch circuits in said page buffer, for holding said program data as loaded into said page buffer until program completion is determined by said program verify means.

3. The non-volatile semiconductor memory device according to claim 2, wherein said memory device has an on-chip copy mode for reading data of a first page of said memory cell array to said page buffer, logically inverting the read data for transfer to said cache, again transferring the data transferred to said cache toward said page buffer, and programming the data transferred to said page buffer into a second page of said memory cell array.

4. The non-volatile semiconductor memory device according to claim 2, wherein
   said memory cell array includes a plurality of NAND cell units laid out in at least one direction, each said NAND cell unit including a serial combination of memory cells having one end connected to a bit line through a first select gate transistor and the other end connected a source line through a second select gate transistor, and wherein
   said NAND cell units laid out in said one direction make up a cell block for use as a unit for all-at-once erase, with gates of said first and second select gate transistors being commonly connected to first and second select gate lines respectively and also with the respective control gates of memory cells arrayed in said one direction commonly connected to a word line.

5. The non-volatile semiconductor memory device according to claim 4, wherein said controller further has the functions of:
   erase control function for applying an erase voltage to all memory cells within a selected cell block and for causing data thereof to shift from said second logic state to said first logic state; and
   erase verify control function for reading data of memory cells within an erased cell block and for verifying completion of shift of the erased data to said first logic state.

6. The non-volatile semiconductor memory device according to claim 5, wherein
   the threshold voltage of a memory cell in said first logic state is negative while the threshold voltage of a memory cell in said second logic state is positive, and wherein
   a verify read operation controlled by said erase verify control function with respect to said erased cell block is performed by precharging said bit lines to 0V. giving a power supply voltage to said source line, giving a first pass voltage to said first and second select gate lines, and giving a first read voltage to all word lines, causing read currents to flow from said source line to said bit lines through the respective channels of NAND cell units, and detecting charged voltages of said bit lines.

7. The non-volatile semiconductor memory device according to claim 6, wherein said third value is negative, and wherein
   a verify read operation controlled by said erratic program verify control function is performed by precharging said bit lines in accordance with logically inverted data of said program data loaded into said data hold circuit, giving a power supply voltage to said source line, giving a first pass voltage to said first and second select gate lines, giving a second read voltage higher than said first read voltage to a word line coupled to memory cells to be checked, and giving said first pass voltage to remaining word lines, causing read currents to flow from said source line to said bit lines through the respective channels of NAND cell units, and detecting charged voltages of said bit lines.

8. The non-volatile semiconductor memory device according to claim 6, wherein said third value is negative, and wherein a verify read operation controlled by said erratic program verify control function is performed by precharging said bit lines in accordance with logically inverted data of said program data loaded into said data hold circuit, giving a power supply voltage to said source line, giving a first pass voltage to said first select gate line, giving a second pass voltage to lower than said first pass voltage to said second select gate line, giving a second read voltage higher than said first read voltage to a word line coupled to memory cells to be checked, and giving said first pass voltage remaining word lines, causing read currents to flow from said source line to said bit lines through the respective channels of NAND cell units, and detecting charged voltages of said bit lines.

9. The non-volatile semiconductor memory device according to claim 6, wherein said third value is zero or positive, and wherein a verify read operation controlled by said erratic program verify control function is performed by precharging said bit lines in accordance with said program data loaded into said data hold circuit, then giving a first pass voltage to said first and second select lines, giving a read voltage equivalent to said third value to a word line couple to memory cells to be checked, and giving said first pass voltage to remaining word lines, causing read currents to flow from said bit lines to said source line through the respective channels of NAND cell units, and detecting discharged voltages of said bit lines.

10. The non-volatile semiconductor memory device according to claim 5, wherein a verify read operation controlled by said over-program verify control function is performed by giving a first pass voltage to said first and second select gate lines, and giving a read voltage equivalent to said fourth value to a word line coupled to memory cells to be checked and remaining word lines, thereby detecting whether the NAND cell units each turns on or off.

11. The non-volatile semiconductor memory device according to claim 5, wherein a verify read operation controlled by said erratic program verify control function is performed based on data loaded in said data hold circuit, said data being an it is given from outside of a chip with an address.

12. The non-volatile semiconductor memory device according to claim 5, wherein said memory device has an on-chip copy mode for reading data of a first page of said memory cell array to said page buffer, logically inverting the read data for transfer to said cache, again transferring the data transferred to said cache toward said page buffer, and programming the data transferred to said page buffer into a second page of said memory cell array.

13. The non-volatile semiconductor memory device according to claim 1, wherein a program operation controlled by said program control function and a verify read operation controlled by said program verify control function are recurrently performed until determination of completion of programming all bits of said program data, and wherein a verify read operation controlled by said erratic program verify control function is performed after the determination of program completion.

14. The non-volatile semiconductor memory device according to claim 1, wherein a program operation controlled by said program control function and a verify read operation by said program verify control function are recurrently performed until determination of completion of programming all bits of said program data, and wherein a verify read operation controlled by said erratic program verify control function and a verify read controlled by said over-program verify control function are performed after the determination of program completion.

15. The non-volatile semiconductor memory device according to claim 1, further comprising:

first, second and third status registers for external notification of verify results based on said program verify control function, said erratic program verify control function and said over-program verify control function, respectively.

16. The non-volatile semiconductor memory device according to claim 1, wherein said third value as guaranteed by said erratic program verify control function is net to less than a normal read voltage as given to a control gate of a selected memory cell in a normal read operation.

17. The non-volatile semiconductor memory device according to claim 1, wherein said controller further having the control functions of:

erase control function for applying an erase voltage to memory cells within a block of said memory cell array and for causing all data within said block to shift from said second logic state to said first logic state; and erase verify control function for reading data of the memory cells within said block and for verifying completion of shift thereof to said first logic state.

18. The non-volatile semiconductor memory device according to claim 17, wherein the threshold voltage of a memory cell in said first logic state is negative the threshold voltage of a memory cell in said second logic state is positive, and wherein a verify read operation controlled by said erase verify control function is performed by precharging a bit line connected to a drain of said memory cell array at a specified voltage, applying a prespecified read voltage to a control gate of a memory cell to be checked, causing a read current to flow from a source or said memory cell to its drain, and then detecting a charged voltage of said bit line.

19. The non-volatile semiconductor memory device according to claim 1, wherein the threshold voltage of a memory cell in said first logic state is negative, the threshold voltage of a memory cell in said second logic state is positive, and said third value is negative, and wherein a verify read operation controlled by said erratic program verify control function is performed by precharging a bit line connected to a drain of said memory cell array in accordance with logically inverted data of said program data as loaded into said data hold circuit, applying a prespecified read voltage to a control gate of a memory cell to be checked, causing a read current to flow from a source of said memory cell to its drain, and detecting a charged voltage of said bit line.

20. The non-volatile semiconductor memory device according to claim 1, wherein the threshold voltage of a memory cell in said first logic state is negative, the threshold voltage of a memory cell in said second logic state is positive, and said third value is negative, and wherein a verify read operation controlled by said erratic program verify control function is performed by precharging a bit line coupled to a drain of said memory cell array in accordance with said program data loaded into said data hold circuit, applying a read voltage used during normal reading to a control gate of a memory cell to be checked, causing a read current to flow from a drain of said memory cell to its source, and detecting a discharged voltage of said bit line.

21. The non-volatile semiconductor memory device according to claim 1, wherein the threshold voltage of a memory cell in said first logic state is negative, the threshold voltage of a memory cell in said second logic state is positive, and said third value is zero or positive, and wherein a verify read operation controlled by said erratic program verify control function is performed by precharging a bit line coupled to a drain of said memory cell array in accordance with said program data loaded into said data hold circuit, applying a read voltage equivalent to said third value to a control gate of a memory cell to be checked, causing a read current to flow from a drain of said memory cell to its source, and detecting a discharged voltage of said bit line.

22. The non-volatile semiconductor memory device according to claim 1, wherein a verify read operation controlled by said over-program verify control function is detecting whether a memory cell turns on or off while giving a read voltage equivalent to said fourth value to a control gate of a memory cell to be checked.

* * * * *